United States Patent
Hayasaki et al.

(10) Patent No.: US 7,018,481 B2
(45) Date of Patent: Mar. 28, 2006

(54) SUBSTRATE TREATING METHOD, SUBSTRATE-PROCESSING APPARATUS, DEVELOPING METHOD, METHOD OF MANUFACTURING A SEMICONDUCTOR DEVICE, AND METHOD OF CLEANING A DEVELOPING SOLUTION NOZZLE

(75) Inventors: Kei Hayasaki, Kamakura (JP); Shinichi Ito, Yokohama (JP); Tatsuhiko Ema, Somers, NY (US); Riichiro Takahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 10/351,422

(22) Filed: Jan. 27, 2003

(65) Prior Publication Data
US 2004/0029026 A1 Feb. 12, 2004

(30) Foreign Application Priority Data
Jan. 28, 2002 (JP) ............................. 2002-017937
Mar. 4, 2002 (JP) ............................. 2002-057764

(51) Int. Cl.
*G03F 7/30* (2006.01)
*B08B 1/04* (2006.01)
*B08B 3/02* (2006.01)
*B08B 5/02* (2006.01)

(52) U.S. Cl. .......................... 134/2; 430/311; 430/325; 396/579; 396/604; 396/605; 396/609; 396/611; 396/625; 396/627; 134/15; 134/16; 134/26; 134/30; 134/32; 134/33; 134/34; 134/36; 134/37

(58) Field of Classification Search ................ 430/311, 430/319, 325, 30, 329, 328; 396/579, 604, 396/605, 609, 611, 625, 627; 134/2, 15, 134/16, 26, 30, 32, 33, 34, 36, 37
See application file for complete search history.

(56) References Cited

U.S. PATENT DOCUMENTS 5,399,203 A * 3/1995 Ishikawa et al. .............. 134/10
6,200,736 B1   3/2001 Tan
6,372,413 B1   4/2002 Ema et al.

(Continued)

FOREIGN PATENT DOCUMENTS

JP        2-46464        2/1990

(Continued)

OTHER PUBLICATIONS

Notification of Reasons for Rejection issued by Japanese Patent Office on Oct. 29, 2004 In Japanese application No. 2002-017937, and English translation of Notification.

(Continued)

*Primary Examiner*—Hoa Van Le
(74) *Attorney, Agent, or Firm*—Finnegan, Henderson, Farabow, Garrett & Dunner, L.L.P.

(57) ABSTRACT

There is disclosed a substrate treating method comprising supplying a treating solution onto a substrate, and continuously discharging a first cleaning solution to the substrate from a first discharge region disposed in a nozzle, while moving the nozzle and substrate with respect to each other in one direction, wherein a length of a direction crossing at right angles to the direction of the first discharge region is equal to or more than a maximum diameter or longest side of the substrate, the nozzle continuously spouts a first gas to the substrate from a first jet region, and the length of a direction crossing at right angles to the direction of the first jet region is equal to or more than the maximum diameter or longest side of the substrate.

12 Claims, 16 Drawing Sheets

U.S. PATENT DOCUMENTS

| | | |
|---|---|---|
| 6,419,408 B1 | 7/2002 | Inada |
| 6,692,165 B1 * | 2/2004 | Tanaka et al. ............... 396/611 |
| 2002/0121341 A1 * | 9/2002 | Tanaka et al. ......... 156/345.21 |

FOREIGN PATENT DOCUMENTS

| | | |
|---|---|---|
| JP | 04-009954 | 1/1992 |
| JP | 06-260412 | 9/1994 |
| JP | 08-138997 | 5/1996 |
| JP | 08-235645 | 9/1996 |
| JP | 10-20508 | 1/1998 |
| JP | 11-295902 | 10/1999 |
| JP | 2000-195773 | 7/2000 |
| JP | 2001-228625 | 8/2001 |
| JP | 2001-244164 | 9/2001 |
| JP | 2001-255668 | 9/2001 |
| JP | 2001-307994 | 11/2001 |
| JP | 2001-319869 | 11/2001 |
| JP | 2002-023386 | 1/2002 |
| JP | 2002-501298 | 1/2002 |

OTHER PUBLICATIONS

Takahashi, R. et al., "Method For Forming a Pattern," U.S. Appl. No. 10/075,619, filed Feb. 15, 2002.

Takahashi, R. et al., "Alkaline Solution and Manufacturing Method, and Alkaline Solution Applied to Pattern Forming Method, Resist Film Removing Method, Solution Application Method, Substrate Treatment Method, Solution Supply Method, and Semiconductor Device Manufacturing Method," U.S. Appl. No. 10/144,025, filed May 14, 2002.

Notification of Reasons for Rejection issued by Japanese Patent Office mailed Sep. 6, 2005 in Japanese application No. 2002-057764, and English translation of Notice.

Notification For Filing Opinion issued by Korean Patent Office mailed Sep. 16, 2005 in Korean application No. 10-2003-5453, and English translation of Notice.

* cited by examiner

SUBSTRATE TREATING METHOD, SUBSTRATE-PROCESSING APPARATUS, DEVELOPING METHOD, METHOD OF MANUFACTURING A SEMICONDUCTOR DEVICE, AND METHOD OF CLEANING A DEVELOPING SOLUTION NOZZLE

CROSS-REFERENCE TO RELATED APPLICATIONS

This application is based upon and claims the benefit of priority from the prior Japanese Patent Applications No. 2002-17937, filed Jan. 28, 2002, and No. 2002-57764, filed Mar. 4, 2002, the entire contents of which are incorporated herein by reference.

BACKGROUND OF THE INVENTION

1. Field of the Invention

The present invention relates to a substrate treating method and substrate treating apparatus in which a treating solution is used to treat a substrate and which are particularly for use in performing a cleaning treatment subsequently to a developing treatment in a process of manufacturing a semiconductor device.

2. Description of the Related Art

When a semiconductor device, liquid crystal display device, and electronic circuit component are manufactured, a substrate is subjected to a developing treatment and thereafter successively subjected to cleaning and drying treatments so as to form a pattern in a process of forming a circuit including a device, wiring, and the like.

A manufacturing process of the semiconductor device first comprises: forming a film to be processed (e.g., an insulating film, conductive film for wiring), and a photosensitive photo resist film on a semiconductor substrate in a known method. Thereafter, this photo resist film is subjected to the developing treatment. Here, as well known, after a predetermined pattern is projected/exposed in the photosensitive photo resist film on the semiconductor substrate via a reticle for exposure, a developing solution is supplied to form the pattern.

After the developing treatment is performed, the developing solution, a dissolution product generated during the developing treatment, and micro particles remain on the surface of the semiconductor substrate. When so-called impurities and contaminants are left in this manner, in a process of using the pattern of the photo resist as a mask to subject the film to be processed (e.g., the insulating film, conductive film forming a material of a wiring layer) to etching processing, an error of dimension is generated, and yield drops in the manufacturing of the semiconductor device.

Therefore, it is necessary to successively perform the cleaning and drying treatments, bring the surface of the semiconductor substrate into a clean state, and remove the remaining developing solution, dissolution product generated during the developing treatment, and micro particles.

A related-art cleaning method comprises: rotating the substrate at a high speed; discharging the cleaning solution via a fixed nozzle; passing the cleaning solution toward a peripheral edge from a middle portion; and replacing the developing solution with the cleaning solution to stop the progress of development reaction. Moreover, the method further comprises: washing away and removing the developing solution, dissolution product generated during the developing treatment, and micro particles from the substrate.

In recent years, technical developments such as miniaturization and high integration of the semiconductor device and bore diameter enlargement of the semiconductor substrate have been performed. When the bore diameter of the semiconductor substrate is enlarged, that is, when an area of the substrate increases, many problems are generated in using the related-art cleaning method.

A discharge port of the nozzle is disposed and fixed in a position above the middle portion of the semiconductor substrate. Therefore, a degree of replacement of the developing solution increases in the middle portion directly contacting the cleaning solution discharged from the nozzle and in the vicinity of the portion on the semiconductor substrate, the dissolution products and micro particles are also effectively removed, and a cleaning effect is enhanced.

However, the peripheral edge of the semiconductor substrate is not directly hit by the cleaning solution with a sufficient pressure, and is low in the cleaning effect as compared with the middle portion of the semiconductor substrate and the vicinity of the portion. Therefore, in the peripheral edge of the semiconductor substrate, a part of the developing solution remains without being replaced, the dissolution products and micro particles are not completely removed and remain, and so-called cleaning spots are generated.

Moreover, in the related-art cleaning method including the drying treatment, the substrate is rotated at a high speed. Therefore, with the enlargement of the bore diameter of the substrate, a physical load is further added, and the pattern of the photo resist formed by the developing treatment is adversely influenced.

For example, when the substrate having a large bore diameter of 300 mm or more is used to manufacture the semiconductor device, the peripheral edge of the semiconductor substrate is influenced by a centrifugal force and cleaning solution flow. A phenomenon remarkably occurs in which the pattern of the photo resist formed by the developing treatment is damaged or pattern falling is generated. Thereby, it is necessary to perform the cleaning and drying treatments without rotating the substrate after the developing treatment.

With the miniaturization of the dimension of the semiconductor device, the developing solution does not sufficiently permeate between the patterns in a related-art developing method, and therefore non-uniformity of a local pattern dimension in a chip raises a problem. Moreover, with the bore diameter enlargement of the substrate, in the related-art developing method, the non-uniformity of the pattern dimension in a substrate plane is caused, and a large problem occurs.

Additionally, in general, alkaline aqueous solutions such as tetramethylammonium hydroxide (TMAH) are used as the developing solution of the photosensitive resist in the manufacturing process of a semiconductor. Since the developing solution is an aqueous solution, wettability to the photosensitive resist surface having a hydrophobic nature is not sufficient. Therefore, when a reaction product generated as a result of neutralization reaction is in the vicinity of the surface, the developing solution is not easily diffused between the reaction product and photosensitive resist surface, and alkali ion concentration locally differs. As a result, it has been observed that a developing rate differs with a position.

For example, there are a pattern disposed in a broad dissolution region and a pattern disposed in a region whose periphery is hardly dissolved. In this case, for the pattern disposed in the broad dissolution region, an amount of reaction products present in the vicinity of the pattern is large, the developing solution is not easily diffused between the reaction product and photosensitive resist, and the progress of the development is inhibited. There is a problem a line dimension becomes large (dimensional difference of a coarse/dense pattern) as compared with the pattern disposed in the region whose periphery is hardly dissolved.

BRIEF SUMMARY OF THE INVENTION

According to one aspect of the present invention, there is provided a substrate treating method comprising: supplying a treating solution onto a substrate; and continuously discharging a first cleaning solution to the substrate from a first discharge region disposed in a nozzle while moving the nozzle and substrate with respect to each other in one direction, wherein a length of a direction crossing at right angles to the direction of the first discharge region is equal to or more than a maximum diameter or longest side of the substrate, the nozzle continuously spouts a first gas to the substrate from a first jet region, and the length of a direction crossing at right angles to the direction of the first jet region is equal to or more than the maximum diameter or longest side of the substrate.

According to another aspect of the present invention, there is provided a substrate treating apparatus comprising: a substrate support portion which supports and fixes a substrate; a nozzle including a first discharge region in which a first solution is discharged to the substrate and a first jet region in which a first gas is spouted to the substrate; and moving means for relatively moving the nozzle with respect to the substrate in a direction substantially parallel to a main surface of the substrate, wherein a width of a direction crossing at right angles to a relative movement direction of the first discharge region and first jet region is equal to or more than a maximum diameter or longest side of the substrate.

According to another aspect of the present invention, there is provided a developing method of developing a photosensitive resist film in which a desired pattern is exposed, comprising: subjecting the exposed photosensitive resist film to a first developing treatment; supplying a cleaning solution having an oxidizing property or alkalinity with respect to the surface of the resist film to the photosensitive resist film subjected to the first developing treatment to perform a first cleaning treatment; subjecting the photosensitive resist film subjected to the first cleaning treatment to a second developing treatment; and subjecting the photosensitive resist film subjected to the second developing treatment to a second cleaning treatment.

According to another aspect of the present invention, there is provided a developing method of developing a photosensitive resist film in which a desired pattern is exposed, comprising: supplying a developing solution to the photosensitive resist film; and fluidizing the developing solution on the photosensitive resist film, wherein the step of fluidizing the developing solution includes an off time for which the developing solution reaches a bottom surface of a region of the photosensitive resist film soluble to the developing solution between a start time and end time.

According to another aspect of the present invention, there is provided a developing method of developing a photosensitive resist film in which a desired pattern is exposed, comprising: supplying a developing solution onto the photosensitive resist film; and fluidizing the developing solution on the photosensitive resist film, wherein a start time to fluidize the developing solution is after an off time for which the developing solution reaches a bottom surface of a region of the photosensitive resist film soluble to the developing solution.

According to another aspect of the present invention, there is provided a cleaning method of a developing solution supply nozzle for use in developing an exposed photosensitive resist film, comprising: supplying a developing solution to the developing solution supply nozzle; and supplying an oxidizing solution to the developing solution supply nozzle which supplies the developing solution onto a substrate to clean the nozzle.

DETAILED DESCRIPTION OF THE INVENTION

Embodiments of the present invention will be described hereinafter with reference to the drawings.

FIRST EMBODIMENT

In the present embodiment, a developing treatment, cleaning treatment, and drying treatment are performed so as to form a pattern having a predetermined dimension and shape in a region to be treated on a substrate. Moreover, in the present embodiment, a developing treatment apparatus of a so-called single wafer process system is used which can continuously perform processes of the developing, developing, and drying treatments in one substrate in one apparatus.

A treatment unit which can continuously perform the developing, cleaning, and drying treatments with respect to the substrate is disposed in the developing treatment apparatus. In the present embodiment, each corresponding treating mechanism is used to perform a series of processes of the developing, cleaning, and drying treatments in this treating unit.

As one example, a developing treatment mechanism is disposed to perform a known scan developing treatment in this treating unit. In a part of this developing treatment mechanism, a movable nozzle for developing is disposed which can move in vertical and horizontal directions so as to discharge a developing solution (treating solution) and scan on the substrate. In this nozzle for developing, an elongated rectangular slit-shaped discharge port is disposed to supply the developing solution to the region to be treated on the substrate by a uniform amount.

Figure 1:
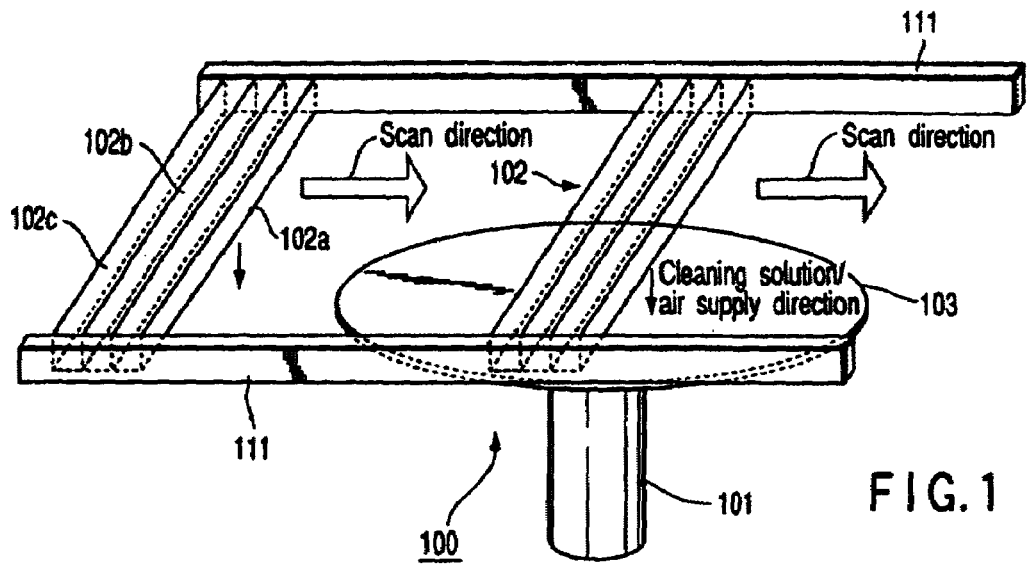
FIG. 1 is a whole diagram showing a treating mechanism of a substrate according to a first embodiment.

Moreover, in addition to the above-described constitution, as shown in FIG. 1, the treating unit also includes a cleaning treatment mechanism. A constitution and operation of the cleaning treatment mechanism disposed in the treating unit which performs the developing, cleaning, and drying treatments will be described hereinafter in detail with reference to FIG. 1.

It is to be noted that FIG. 1 shows a main constituting part related to a cleaning treatment mechanism 100.

The unit for performing the developing and cleaning treatments includes the cleaning treatment mechanism 100 shown in FIG. 1. The cleaning treatment mechanism 100 includes main constituting components of a chuck for fixing/supporting 101, nozzle for cleaning 102, and scan mechanism 111. The chuck for fixing/supporting 101 and nozzle for cleaning 102 can relatively move the nozzle 102 with respect to the substrate, when the scan mechanism 111 moves the nozzle 102.

In the cleaning treatment mechanism 100, after the developing treatment is performed, a substrate 103 is laid and fixed onto the chuck for fixing/supporting 101, a predetermined cleaning solution is supplied from the nozzle for cleaning 102, and the surface of the substrate 103 is subjected to the cleaning treatment. It is to be noted that the substrate 103 has a diameter of about 300 mm in one example.

In the present embodiment, as described above, the nozzle for cleaning 102 of a movable type is used. Concretely, the nozzle for cleaning 102 can move substantially in parallel with the surface of the substrate 103. Moreover, as one example, the nozzle for cleaning 102 is constituted of three nozzles 102a, 102b, 102c.

Figure 2:
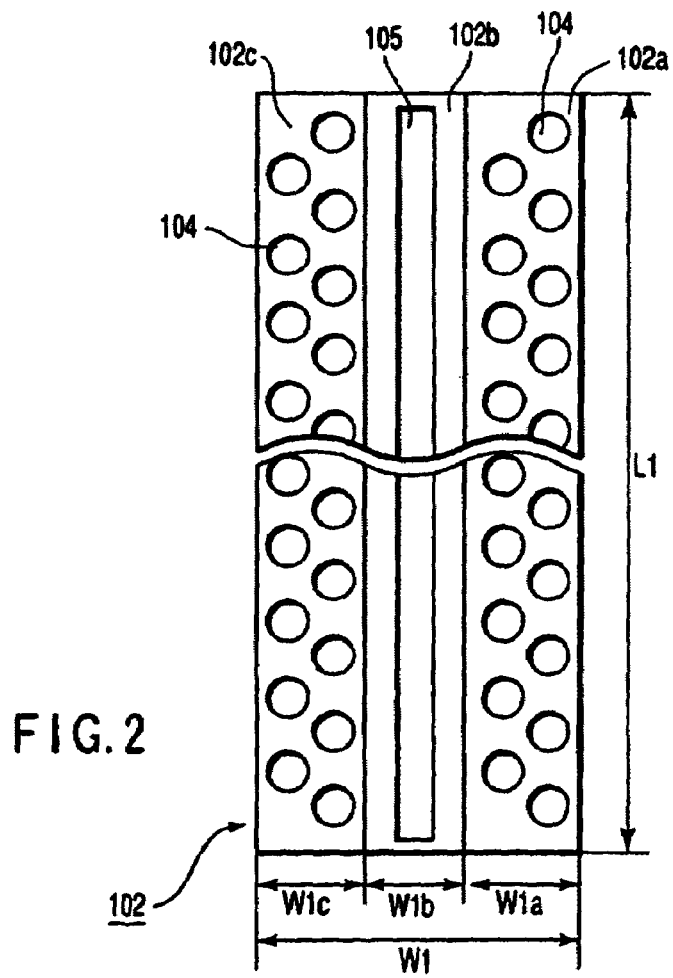
FIG. 2 is a plan view showing a constitution of a nozzle for a cleaning treatment according to the first embodiment.

In the present embodiment, as shown in FIG. 2, the nozzle for cleaning 102 is constituted by disposing three nozzles 102a to 102c adjacent to one another and integrally combining the nozzles.

In the present embodiment, the nozzles 102a, 102c discharge the cleaning solution to the substrate 103. Moreover, the nozzle 102b spouts air with a high pressure to the substrate 103. It is to be noted that the nozzles 102a to 102c can independently be operated to discharge or spout the cleaning solution or high-pressure air.

Here, the nozzles for cleaning 102 are disposed opposite to one another in order of the cleaning solution supply nozzle 102a, air supply nozzle 102b, cleaning solution supply nozzle 102c in a scan direction.

Moreover, as shown in FIG. 2, the respective nozzles 102a to 102c are formed in elongated rectangular shapes, and a large number of cleaning solution discharge ports 104 for discharging the cleaning solution and a jet port for air 105 are formed in bottom surfaces of the nozzles disposed opposite to the substrate 103. Here, the respective cleaning solution supply nozzles 102a, 102c are disposed in two rows in parallel with each other.

Furthermore, a large number of circular discharge ports 104 are arranged in the bottom surfaces of the respective cleaning solution supply nozzles 102a, 102c. Here, the discharge ports 104 are formed in circular shapes, and can discharge each cleaning solution to the outside with the high pressure. Additionally, the discharge ports 104 are alternately arranged in two rows in the respective cleaning solution supply nozzles 102a, 102c so as to form the rows extending in parallel with each other. A region of the cleaning solution supply nozzle 102a in which a plurality of discharge ports 104 are arranged is a first discharge region. A region of the cleaning solution supply nozzle 102c in which a plurality of discharge ports 104 are arranged is a second discharge region.

In a process of performing the cleaning treatment, the predetermined cleaning solution is discharged via the cleaning solution discharge ports 104. Each of the cleaning solution supply nozzles 102a, 102c can uniformly supply a predetermined cleaning solution to the region to be treated on the substrate 103 in a direction vertical to the scan direction. At this time, as described above, the respective cleaning solution supply nozzles 102a, 102c are arranged in two rows in parallel with each other. The discharge ports 104 are also arranged in two rows in parallel with each other in each nozzle. Therefore, while the nozzle is scanned on the substrate, the cleaning solution is discharged via the circular discharge ports 104 of the cleaning solution at the high pressure, and can substantially linearly be supplied to the region to be treated of the substrate 103.

Moreover, in the air supply nozzle 102b, the jet port 105 is formed in a slit shape. Thereby, the air with the high pressure can continuously and uniformly be spouted to the region to be treated of the substrate 103 in the direction substantially vertical to the scan direction without being interrupted. It is to be noted that the jet port is a first jet region.

As described above, the nozzle for cleaning 102 is constituted to continuously and substantially linearly supply each cleaning solution and high-pressure air to the region to be treated on the substrate 103 without being interrupted.

It is to be noted that in the present embodiment, for a structure to be applied to the substrate 103 having a diameter of about 300 mm, as one example, each of the bottom surfaces of the nozzles 102a to 102c has transverse widths $W_{1a}$, $W_{1b}$, $W_{1c}$=5 mm, and longitudinal length $L_1$=305 mm. Moreover, these three nozzles are integrated and used, and the whole nozzle for cleaning 102 includes a structure in which the bottom surface has dimensions such as a transverse width $W_1$=15 mm and longitudinal length $L_1$=305 mm.

Here, especially the longitudinal length $L_1$ of the nozzle for cleaning 102 is set to be larger by about several millimeters with respect to the diameter (e.g., 300 mm) of the substrate 103, and each cleaning solution and air with the high pressure may securely be supplied over the whole surface of the substrate 103.

Figure 4:
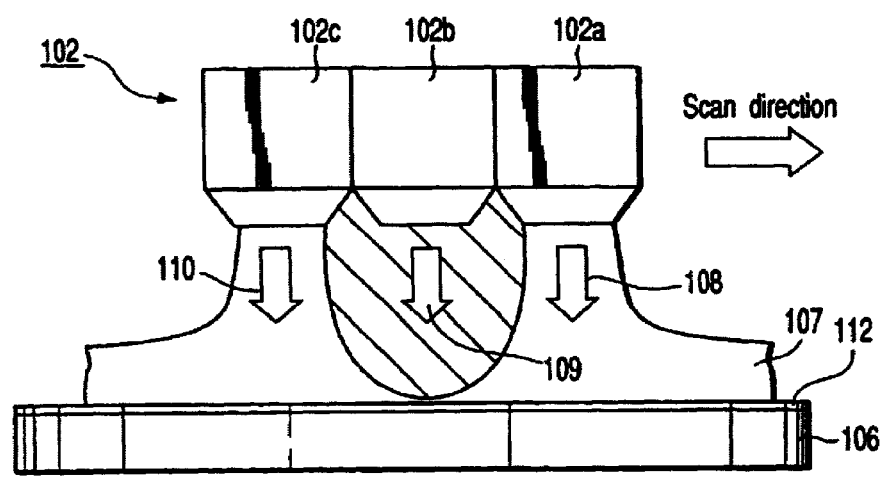
FIG. 4 is a sectional view showing a substrate treating method according to the first embodiment.

It is to be noted that in a cleaning mechanism for use in the present embodiment, the constitution of the nozzle for cleaning 102 is not limited to a constitution in which as shown in FIG. 4, a cleaning solution A 108, high-pressure dry air 109, and cleaning solution B 110 are discharged/spouted in order from a front side of the scan direction. For example, the nozzle for cleaning 102 may also be constituted to discharge/spout the cleaning solution A 108 and high-pressure dry air 109 in order from the scan direction front side. Moreover, the nozzle for cleaning 102 may also be constituted so that the high-pressure dry air 109 and cleaning solution B 110 are disposed in order from the scan direction front side. When the dry air with the high pressure and the cleaning solution are simultaneously supplied, the cleaning solution can be separated from the developing solution, and therefore the cleaning of the substrate is possible.

Moreover, in the cleaning treatment mechanism for use in the present embodiment, it is possible to appropriately change the number and arrangement of the nozzles in the constitution of the nozzle for cleaning 102. Concretely, it is possible to change the numbers of nozzles for supplying the cleaning solution and nozzles for supplying the air and change each constitution and arrangement in accordance with cleaning use. For example, the arrangements of the nozzle for supplying the cleaning solution and the nozzle for supplying the air in the nozzles for cleaning 102 can be changed to supply the high-pressure air, ozone water, and high-pressure air, or the high-pressure air, hydrogen water, and high-pressure air to the region to be treated of the substrate 103 in order.

In the present embodiment, the above-described cleaning treatment mechanism is used to subject the substrate to the cleaning treatment. In the present embodiment, in the process of using the above-described treating unit to manufacture a semiconductor device as one example, first a developing treatment step, then a cleaning treatment step are successively performed so as to form a pattern on a photosensitive photo resist film on a semiconductor substrate. Therefore, it is assumed as one example that the semiconductor substrate is used in the substrate.

It is to be noted that in the present embodiment the semiconductor substrate has a diameter of about 300 mm as one example.

Moreover, as not especially shown, the cleaning treatment mechanism 100 includes a nozzle for cleaning the back surface of the substrate 103 (=lower surface of the substrate 103) in a predetermined position. The cleaning solution is appropriately discharged, and dissolution products or micro particles can be removed from the back surface of the substrate 103. At this time, the structure of the nozzle for cleaning the back surface of the substrate 103 is not especially limited, and a known structure may be used. Furthermore, this nozzle may be disposed in positions such as a backside of the substrate 103 especially to clean a peripheral edge of the back surface of the substrate 103.

A cleaning treatment method of the present embodiment will concretely be described hereinafter with reference to FIGS. 3A, 3B, 4. Here, the treating unit including the cleaning treatment mechanism 100 shown in FIG. 1 is used.

A film to be processed (e.g., insulating film, or conductive film for wiring), and reflection preventive film are formed beforehand on the semiconductor substrate. Subsequently, a photosensitive photo resist film of a chemical amplification type is successively formed on the films. Thereafter, a KrF excimer laser is used in a light source to perform reduced projecting exposure via a reticle for exposure, and the photo resist film is irradiated with a pattern having a predetermined dimension and shape.

Subsequently, the semiconductor substrate including the photo resist film is heat-treated. Thereafter, the above-described movable nozzle for developing is used to perform a so-called scan developing treatment, and the pattern having the predetermined dimension and shape is formed on the photo resist film. Here, while the nozzle for developing is scanned at a constant speed of about 60 mm/sec, the predetermined developing solution is supplied to the photo resist film on the semiconductor substrate, a known paddle developing treatment is performed, and the pattern is formed on the photo resist film.

It is to be noted that an alkaline tetramethylammonium aqueous solution (=pH value: 13.4) is used in the developing solution for the photo resist.

Next, the method comprises: performing the developing treatment for a predetermined time; subsequently subjecting the semiconductor substrate to the cleaning treatment; stopping development reaction in the photo resist film; and washing away and removing the developing solution, dissolution product generated by the developing treatment, and micro particles to the outside of the semiconductor substrate.

Here, without rotating the substrate as in the related art, the semiconductor substrate set to be in a stationary state on the chuck for fixing/supporting 101 is subjected to the cleaning treatment to remove the developing solution, dissolution product generated by the developing treatment, and micro particles. Thereafter, the drying treatment is performed to form the pattern of the photo resist having the predetermined dimension and shape on the semiconductor substrate.

Thereafter, the cleaning treatment method will concretely be described. In the present embodiment, while the nozzle for cleaning 102 is scanned over the whole surface of the semiconductor substrate, the cleaning treatment is performed to remove the developing solution, dissolution product generated by the developing treatment, and micro particles.

Figure 3A:
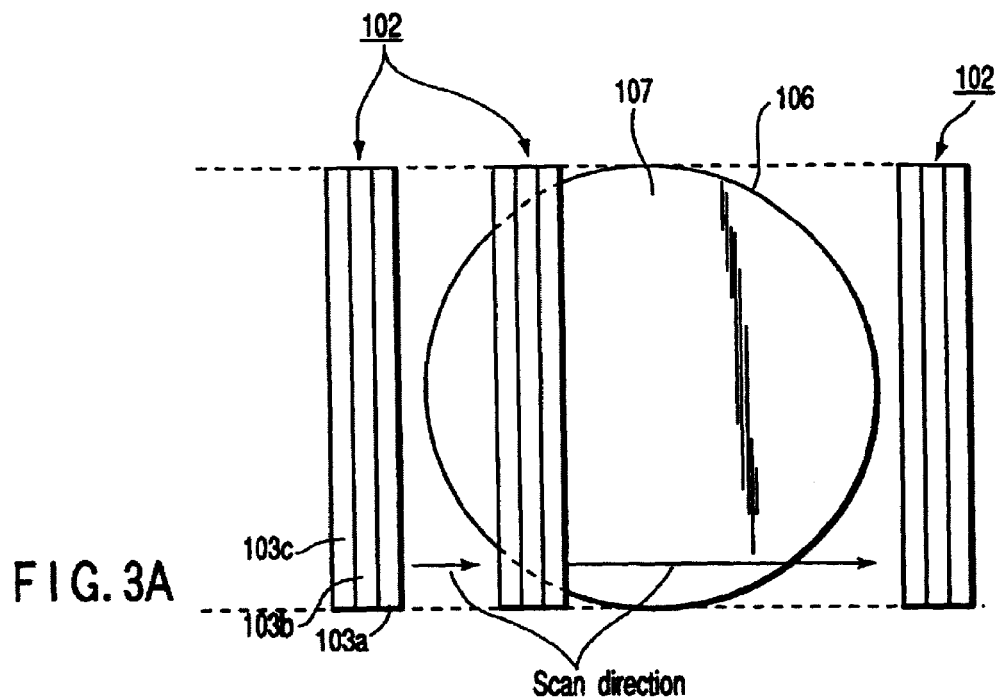
FIGS. 3A, 3B are sectional views showing a substrate treating method according to the first embodiment.
Figure 3B:
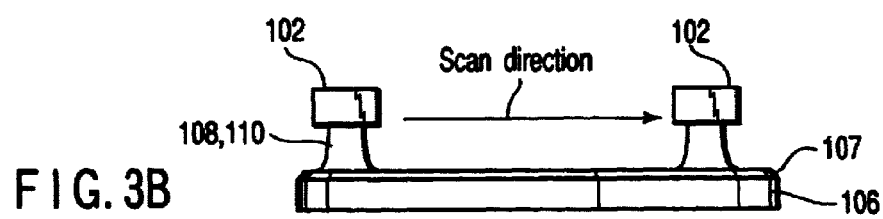

Concretely, as shown in FIGS. 3A, 3B, first the nozzle for cleaning 102 is brought close to one end of the semiconductor substrate. Thereafter, while a constant interval is kept from the film of a developing solution 107 on a semiconductor substrate 106, the nozzle is moved and scanned in parallel toward the other end, and the cleaning treatment is performed. At this time, while the nozzle for cleaning 102 is scanned, as shown in FIG. 4, the cleaning solution A 108, high-pressure dry air 109, and cleaning solution B 110 are supplied onto the substrate via the cleaning solution supply nozzle 102a, air supply nozzle 102b, and cleaning solution supply nozzle 102c. It is to be noted that the photo resist film (not shown) is formed on the semiconductor substrate 106.

In the present embodiment, as described above, for the nozzle for cleaning 102, the longitudinal length $L_1$ (e.g., 305 mm) is larger than the diameter (e.g., 300 mm) of the semiconductor substrate 106. Moreover, the width of the direction crossing at right angles to the scan direction of a region in which the cleaning solutions 108, 110 and dry air 109 are supplied is not less than the diameter of the semiconductor substrate 106. Therefore, the cleaning solutions 108, 110 and dry air 109 are supplied to the whole surface of the semiconductor substrate 106 in the constitution. Therefore, when the high-pressure dry air 109 is spouted, and the nozzle for cleaning 102 is scanned as described above, the cleaning solution A 108 and cleaning solution B 110 are supplied to the whole surface of the semiconductor substrate 106.

In the present embodiment, as one example, the ozone water which is an oxidizing cleaning solution is used in the cleaning solution A 108. Moreover, the hydrogen water which is a reducing cleaning solution is used in the cleaning solution B 110. At this time, ozone concentration in the ozone water and hydrogen concentration in the hydrogen water are set to about 0.1 to 5 ppm.

Moreover, as shown in FIG. 4, the high-pressure dry air 109 blocks the cleaning solution A 108 and cleaning solution B 110 discharged from the nozzles 102a and 102c disposed on opposite sides of the nozzle for cleaning 102 with respect to the film of the developing solution 107 on the semiconductor substrate 106 to such an extent that the solution film is slightly left in a thickness of about several hundreds of nanometers to several hundreds of micrometers. The dry air functions as a so-called air curtain. In this case, the high-pressure dry air 109 is spouted at a wind velocity of about 0.1 to 10 m/sec, and requires a pressure and flow rate to such an extent that the cleaning solution A 108 is slightly left in a solution film shape as the air curtain.

Moreover, at this time, the nozzle for cleaning 102 is brought close to a height of 3 mm or less from the surface of the developing solution 107 on the semiconductor substrate 106, and a constant interval is kept to such an extent that the nozzle does not contact a photo resist film 112. Thereafter, while the cleaning solution A 108, cleaning solution B 110, and dry air with the high pressure are supplied as described above, the nozzle for cleaning 102 is scanned over the whole surface of the semiconductor substrate 106 from one end to the other end of the semiconductor substrate 106. Therefore, the cleaning solution A 108, high-pressure dry air 109, and cleaning solution B 110 are supplied in order in the region to be treated on the semiconductor substrate 106.

In the present invention, as one example, the nozzle for cleaning 102 is scanned on the same path in the same direction as those of the nozzle for developing, which supplies the developing solution 107. Moreover, at this time, the nozzle for cleaning 102 is scanned at a constant speed of about 60 mm/sec which is the same speed as a movement speed of the developing nozzle for supplying the developing solution 107.

In this case, since the nozzle is scanned at the substantially constant speed in the same direction on the same path, as compared with the supply of the developing solution 107, a time from when the developing solution 107 is supplied to the whole surface of the semiconductor substrate 106 until the solution is replaced with the cleaning solution A 108 can be controlled to be equal. Therefore, a difference is generated in a time to start the development reaction between the regions in a process of forming the pattern in the photo resist film. However, a time for which the developing solution functions in the whole surface of the semiconductor substrate 106 is set to be equal, and it is possible to precisely form the pattern in the photo resist film.

It is to be noted that in the present embodiment the replacement of the developing solution with the cleaning solution indicates that components of the developing solution are changed by the components of the cleaning solution, and the function of the developing solution onto the photo resist is stopped.

Moreover, at this time, the cleaning solution (e.g., pure water) is discharged from a nozzle (not especially shown) for cleaning the above-described back surface, and the cleaning treatment of the back surface of the semiconductor substrate 106 is performed. In this manner, when the front surface of the semiconductor substrate 106 is cleaned, the back surface is cleaned. Thereby, the developing solution, dissolution product, and micro particles removed from the front surface of the semiconductor substrate 106 can securely be discharged without being left in the semiconductor substrate 106 which includes the back surface. Furthermore, when the front and back surfaces are simultaneously cleaned/treated, it is possible to securely obtain the cleaning effect of the semiconductor substrate 106 in a shorter time.

The cleaning treatment is performed as described above, and successively the film of the cleaning solution left on the pattern of the photo resist is removed. Here, the semiconductor substrate 106 is rotated at a high speed in a range of a rotation speed of 1000 to 20000 rpm to remove the film of the cleaning solution.

It is to be noted that in the present embodiment the nozzle for cleaning 102 may be moved with respect to the semiconductor substrate 106 to supply the respective cleaning solutions and dry air with the high pressure. Therefore, it is also possible to fix the nozzle for cleaning 102, discharge the respective cleaning solutions in this state, move the semiconductor substrate 106 including the chuck for fixing/supporting 101, and supply the cleaning solutions 108, 110 and dry air 109 to the region to be treated on the semiconductor substrate 106.

The cleaning method of the present invention comprises: discharging or jetting the cleaning solution A 108, high-pressure dry air 109, and cleaning solution B 110 in order onto the developing solution 107 on the semiconductor substrate 106 along the scan direction, and the effect is as follows.

In the nozzle for cleaning 102, the cleaning solution supply nozzle 102a discharges the cleaning solution A 108 to replace the developing solution 107 mounted on the semiconductor substrate 106 with the cleaning solution A 108. Additionally, the developing solution, dissolution product generated by the developing treatment, and micro particles are washed away to the outside of the semiconductor substrate 106.

At this time, the high-pressure dry air 109 is jetted to the discharged solution surface of the cleaning solution A 108 with great force. Thereby, as compared with the related-art cleaning method comprising: simply supplying the cleaning solution from above; and rotating and spreading the solution in a plane, the cleaning solution A 108 is equally pressurized in the whole surface of the semiconductor substrate 106, and the cleaning effect can be enhanced.

Concretely, when the air supply nozzle 102b spouts the high-pressure dry air 109, the developing solution 107 replaced with the cleaning solution A 108 is pressurized in a direction of the peripheral edge, and securely discharged to the outside of the semiconductor substrate 106. Moreover, the high-pressure dry air 109 prevents these discharged solutions from sticking to the region subjected to the cleaning treatment on the semiconductor substrate 106. Additionally, at this time, the high-pressure dry air 109 needs to be linearly connected in a direction substantially vertical to the scan direction without being interrupted on the semiconductor substrate 106 to form the so-called air curtain.

Furthermore, after the high-pressure dry air 109 is spouted, the cleaning solution B 110 is continuously discharged, and a small amount of developing solution 107 remaining in the pattern of the photo resist is washed away to the outside of the semiconductor substrate 106. At this time, the cleaning solution B 110 is continuously discharged to the region to which the high-pressure dry air 109 is spouted. It is possible to simultaneously wash away and remove the dissolution product, micro particles, and deposit to the outside of the semiconductor substrate 106 so as to be prevented from sticking to the pattern of the photo resist.

As described above, in the present embodiment, the ozone water having an oxidizing property is used in the cleaning solution A 108. The ozone water oxidizes the dissolution product generated in the process of the developing treatment, micro particles, and deposit. Especially, there is an effect of oxidizing an organic matter, decomposing a molecular structure, and dividing the matter into particles. Therefore, after the developing treatment, the organic matter is inhibited from sticking to the photo resist again, and the generation of defect portions of the resist pattern can largely be reduced.

At this time, the ozone water may also be used in a low concentration of about 1 ppm. With this degree of concentration, the ozone water does not damage the pattern of the photo resist. In this case, the water functions to such an extent that only a side wall portion of the pattern of the photo resist is slightly etched. Therefore, roughness of the pattern dimension of the photo resist (=local dispersion) is reduced, and an effect is obtained that the uniformity of the dimension is enhanced in the plane.

Moreover, as described above, the hydrogen water having the reducing property is used in the cleaning solution B 110 in the present embodiment.

After the organic matter is decomposed by the ozone water as described above, the particles of the organic matter left without being washed away sometimes stick to the surface of the photo resist film. When the particles of the organic matter adhere to the pattern of the photo resist, the defect portions (=dispersion of the pattern dimension) are generated in the resist pattern, and errors of the dimension and shape are generated in the subsequent etching step.

To solve the problem, as in the present embodiment, after the ozone water is supplied, the hydrogen water is discharged, and the surfaces of the particles of the organic matter are thereby reduced, and detached from the surface of the photo resist film again. Thereby, additionally, contaminants and impurities are washed away to the outside of the semiconductor substrate 106, and the cleaning treatment can further securely be performed.

In the present embodiment, the ozone water is used in the cleaning solution A 108, and the hydrogen water is used in the cleaning solution B 110. These solutions are successively and continuously supplied to the developing solution 107 on the semiconductor substrate 106. In this case, the ozone water is an oxidizing aqueous solution, whereas the hydrogen water is a reducing aqueous solution. When the ozone and hydrogen waters are alternately mixed, properties of the solutions are mutually offset, and the function of the cleaning solution, and the cleaning effect are deteriorated. Therefore, when the cleaning solutions having opposite properties are continuously used in the process of the cleaning treatment, a mutually mixed amount is reduced, and it is necessary to prevent the deterioration of the function of the cleaning solution and the deterioration of the cleaning effect.

To solve the problem, in the present embodiment, the high-pressure dry air 109 is spouted to form the air curtain between the cleaning solution A 108 (e.g., ozone water) and cleaning solution B 110 (e.g., hydrogen water), the mutually mixed amount is thereby reduced, and it is possible to prevent the deterioration of the function of the cleaning solution and the deterioration of the cleaning effect.

When the cleaning solutions having the opposite properties are used in this manner, the dry air with the high pressure is spouted to separate the cleaning solutions from each other, the so-called air curtain is formed to inhibit the cleaning solutions from being mixed with each other, and this is effective in keeping the cleaning effect to be constantly high.

It is to be noted that in the present embodiment the ozone water is used in the cleaning solution A and the hydrogen water is used in the cleaning solution B. However, as long as effects similar to these can be obtained, it is possible to change the cleaning solution to another type. For example, the ozone water is used in the cleaning solution A, pure water is used in the cleaning solution B, and the cleaning treatment can be performed as described above. Moreover, surfactant is added to the pure water for use in the cleaning solution B, and the impurities and contaminants can more effectively be removed.

Moreover, in the present embodiment, the high-pressure dry air 109 is jetted to pressurize the films of the cleaning solution A 108 and cleaning solution B 110, and the thickness can be reduced to about several hundreds of nanometers to several hundreds of micrometers right under the air curtain. That is, amounts of the cleaning solution A 108 and cleaning solution B 110 are reduced to slight amounts in a region in which the high-pressure dry air 109 has passed in the semiconductor substrate 106. Therefore, thereafter, without throwing off the cleaning solution by high-speed rotation (=rotation speed: 1000 to 4000 rpm) as in the related-art method, the effect of the drying treatment can easily be given to the semiconductor substrate 106. In this case, since a physical load (=centrifugal force, water flow of the cleaning solution, and the like) is not applied to the semiconductor substrate 106, even with the use of the semiconductor substrate having a large bore diameter (e.g., diameter of about 300 mm), it is possible to easily impart the effect of the drying treatment without damaging the pattern of the photo resist.

The effect of the present embodiment will be compared with that of the use of the related-art cleaning method, and described hereinafter with reference to FIGS. 5A, 5B.

Here, the method comprises: first scanning the nozzle for cleaning for use in the present embodiment as described above; supplying the ozone water, air, and hydrogen water in order as one example; carrying out the cleaning treatment of the substrate; and thereafter measuring dimensional uniformity and the number of defect portions of the photo resist pattern. Moreover, here, the method comprises: repeating the cleaning treatment about three times in one example; and measuring the dimensional uniformity in the substrate plane and the number of defect portions of the pattern in each treatment. FIGS. 5A, 5B show the effects of three cleaning treatments using the present-embodiment method, and related-art cleaning method. The effect of the present embodiment is considered by comparing an average value of three cleaning treatments with the value of the related-art cleaning method. As a result, it has been found that the effects shown in FIGS. 5A, 5B are obtained in the present embodiment.

Figure 5A:
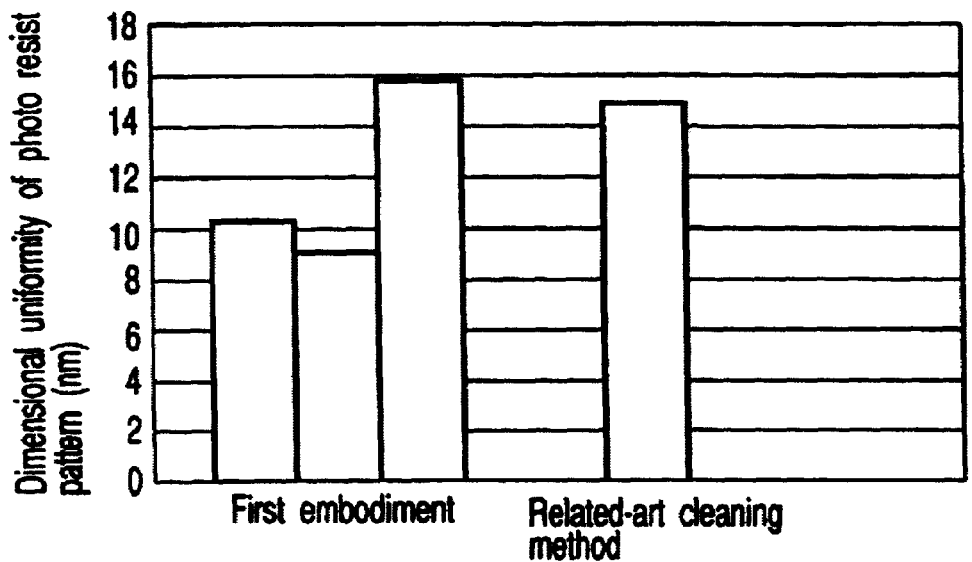
FIGS. 5A, 5B are diagrams showing an effect of the first embodiment.

FIG. 5A shows results of measurement of the dimensional uniformity of the photo resist pattern in the plane of the substrate (=wafer) in each of the present-embodiment method and related-art cleaning method. In the method according to the present embodiment, as shown in FIG. 5A, the dimensional uniformity can be enhanced by about 20% as compared with the related-art cleaning method. Here, the dimensional uniformity indicates a degree of dispersion of dimension obtained as a result of measurement performed in a plurality of points of patterns using the patterns which have to have the same dimension in design as objects.

Figure 5B:
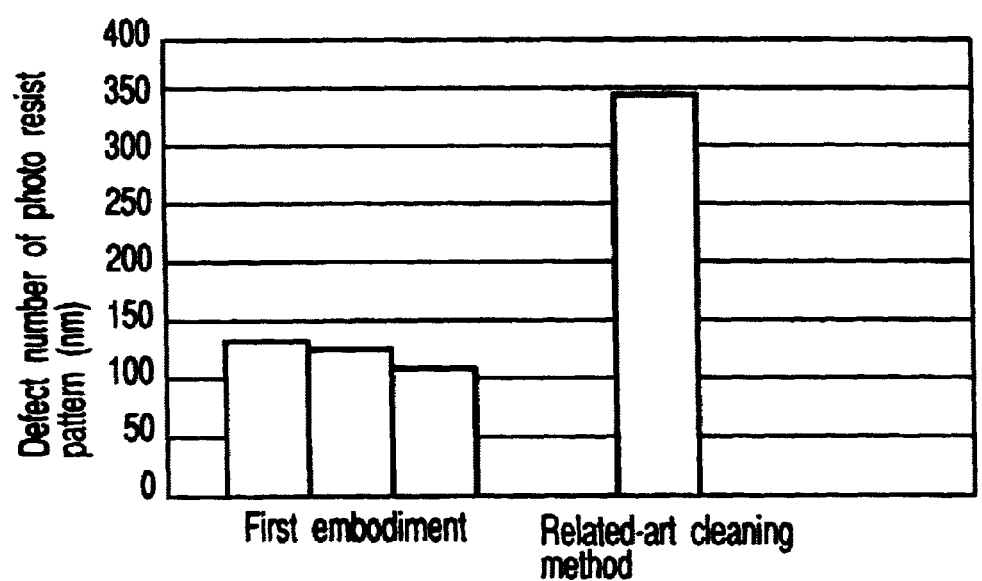

Moreover, FIG. 5B shows results of the measurement of the number of defect portions generated in the photo resist pattern in each of the present-embodiment and related-art methods. In the present embodiment, as shown in FIG. 5B, as a result of the measurement of the number of defect portions of the photo resist pattern on the substrate (=wafer), the number can be decreased by 65% as compared with the use of the related-art cleaning method. Here, the defect portion indicates a state in which the impurities and contaminants of the organic matters stick to the photo resist pattern and an error is generated in the dimension.

In this manner, the present embodiment relates to the semiconductor substrate which has a large bore diameter (e.g., diameter of about 300 mm). Additionally, it is possible to enhance the cleaning effect in the developing treatment of the photo resist as compared with the related-art cleaning method.

Figure 30:
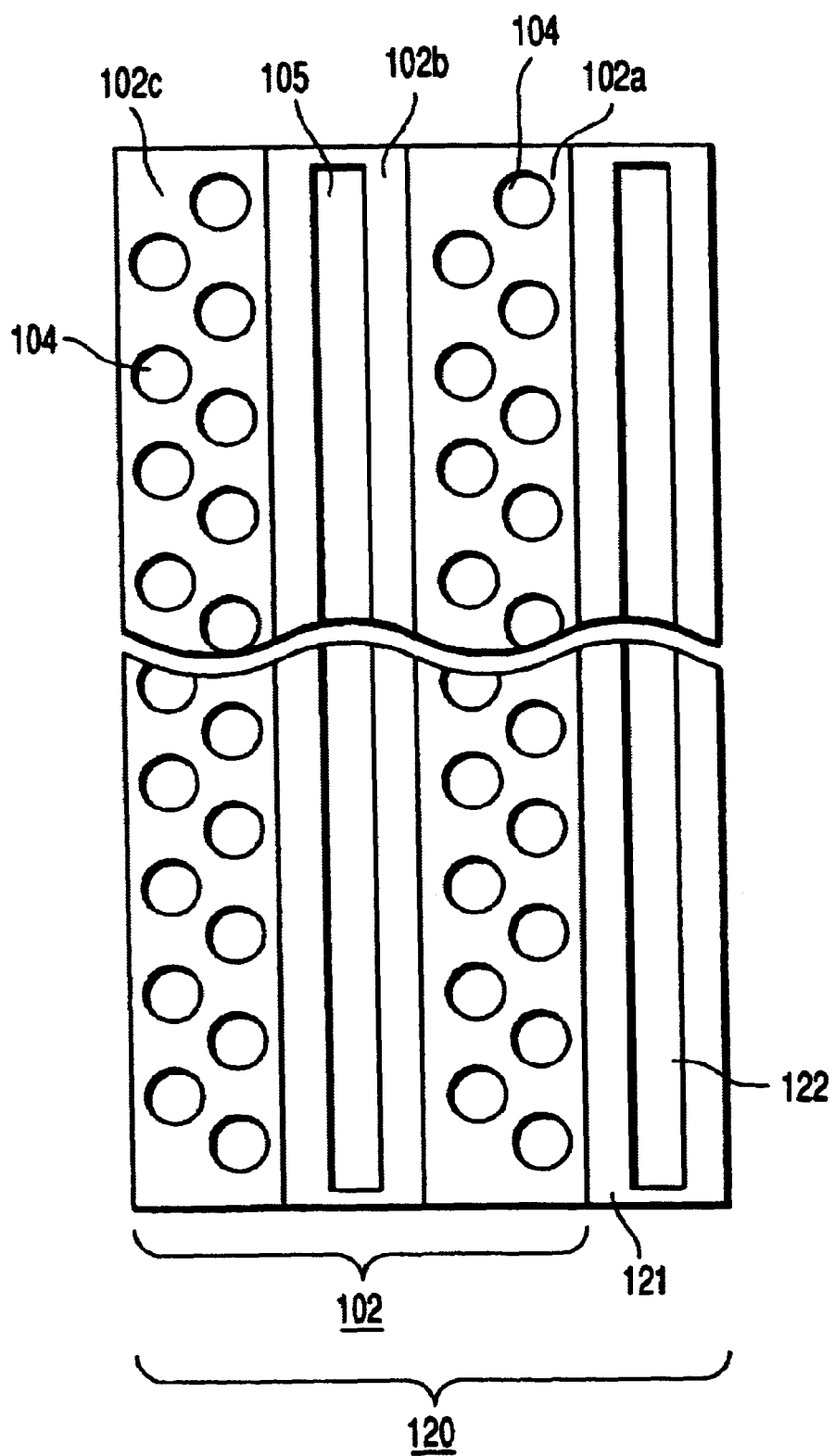
FIG. 30 is a plan view showing a constitution of a nozzle for treating the substrate according to the first embodiment.

It is to be noted that a nozzle 120 integrally constituted of the nozzle for cleaning 102 and nozzle for developing 121 as shown in FIG. 30 may also be used. As shown in FIG. 30, the nozzle 120 includes the nozzle for cleaning 102 and nozzle for developing 121. A discharge port 122 for discharging the developing solution is formed in a slit shape in the nozzle for developing 121. A length of a direction of the discharge port 122 crossing at right angles to the scan direction is equal to or more than the maximum diameter or longest side of the substrate. Thereby, the developing solution can uniformly be supplied to the region to be treated of the substrate 103 continuously without being interrupted in a direction substantially vertical to the scan direction. It is to be noted that the nozzle for developing 121 forms a third discharge region. It is to be noted that the position of the nozzle for developing 121 is not limited to a front side of the nozzle for cleaning 102 with respect to the scan direction as shown in FIG. 30. For example, the nozzle for developing 121 may also be disposed on a rear side of the nozzle for cleaning 102 with respect to the scan direction.

With this nozzle, the developing treatment is not performed in parallel with the cleaning treatment. At a developing treatment time, the nozzle for developing 121 discharges the developing solution, and the nozzle for cleaning 102 does not discharge the cleaning solution or jet out the gas. Moreover, at a cleaning treatment time, the nozzle for cleaning 102 discharges the cleaning solution and jets out the gas, and the nozzle for developing 121 does not discharge the developing solution.

It is to be noted that in the above-described embodiment the developing solution has been described as a treating solution. However, an etching solution may also be used as the treating solution.

SECOND EMBODIMENT

In the present embodiment, the developing, cleaning, and drying treatments are performed in order to form the pattern which has a predetermined dimension and shape in the region to be treated of the substrate in the same manner as in the first embodiment. Moreover, in the present embodiment, a so-called developing treatment apparatus of a single wafer process system is used in which one substrate can continuously be subjected to the process of the developing, cleaning, and drying treatments in one apparatus.

A treatment unit which can continuously perform the developing, cleaning, and drying treatments with respect to the substrate is disposed in the developing treatment apparatus. In the present embodiment, each corresponding treating mechanism is used to perform a series of processes of the developing, cleaning, and drying treatments in this treating unit.

As one example, the developing treatment mechanism is disposed to perform the known scan developing treatment in this treating unit. In a part of this developing treatment mechanism, the movable nozzle for developing is disposed which can move in the vertical and horizontal directions so as to discharge the developing solution and scan on the substrate. In this nozzle for developing, the elongated rectangular slit-shaped constitution is disposed to supply the developing solution to the region to be treated on the substrate by the uniform amount.

Figure 6:
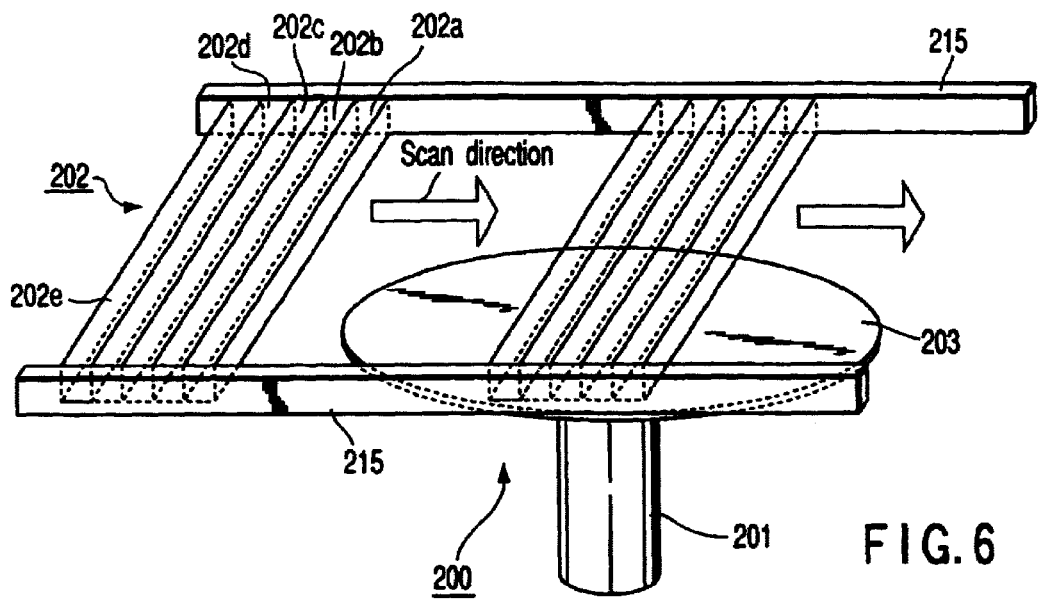
FIG. 6 is a whole diagram showing a treating mechanism of a substrate according to a second embodiment.

Moreover, in addition to the above-described constitution, as shown in FIG. 6, the treating unit also includes the cleaning treatment mechanism. The constitution and operation of the cleaning treatment mechanism disposed in the treating unit which performs the developing, cleaning, and drying treatments will be described hereinafter in detail with reference to FIG. 6.

It is to be noted that FIG. 6 shows the main constituting part related to a cleaning treatment mechanism 200.

The unit for performing the developing and cleaning treatments includes the cleaning treatment mechanism 200 shown in FIG. 6. The cleaning treatment mechanism 200 includes main the constituting components of a chuck for fixing/supporting 201, and cleaning nozzle 202. Moreover, these chuck for fixing/supporting 201 and cleaning nozzle 202 are constituted in movable types, and can independently be moved.

In the cleaning treatment mechanism 200, after the developing treatment is performed, a substrate 203 is laid and fixed onto the chuck for fixing/supporting 201, the predetermined cleaning solution is supplied from the cleaning nozzle 202, and the surface of the substrate 203 is subjected to the cleaning treatment.

It is to be noted that the substrate 203 has a diameter of about 300 mm in one example.

In the present embodiment, the cleaning nozzle 202 is constituted of five nozzles 202a to 202e. A moving mechanism 215 moves the nozzle 202 in parallel with the surface of the substrate 203.

Moreover, as not especially shown, the cleaning treatment mechanism 200 includes a nozzle for cleaning the back surface (lower surface) of the substrate 203 in the predetermined position. The cleaning solution is appropriately discharged, and the dissolution products or micro particles can be removed from the back surface of the substrate 203. At this time, the structure of the nozzle for cleaning the back surface of the substrate 203 is not especially limited, and the known structure may be used. Furthermore, this nozzle may be disposed in the positions such as the backside of the substrate 203 especially to clean the peripheral edge of the back surface of the substrate 203.

In the present embodiment, as described above, the cleaning nozzle 202 of the movable type is used. Concretely, it is possible to move the cleaning nozzle 202 in parallel with the surface of the substrate 203 while keeping a constant interval. Moreover, as one example, the cleaning nozzle 202 is constituted of five nozzles 202a to 202e.

Figure 7:
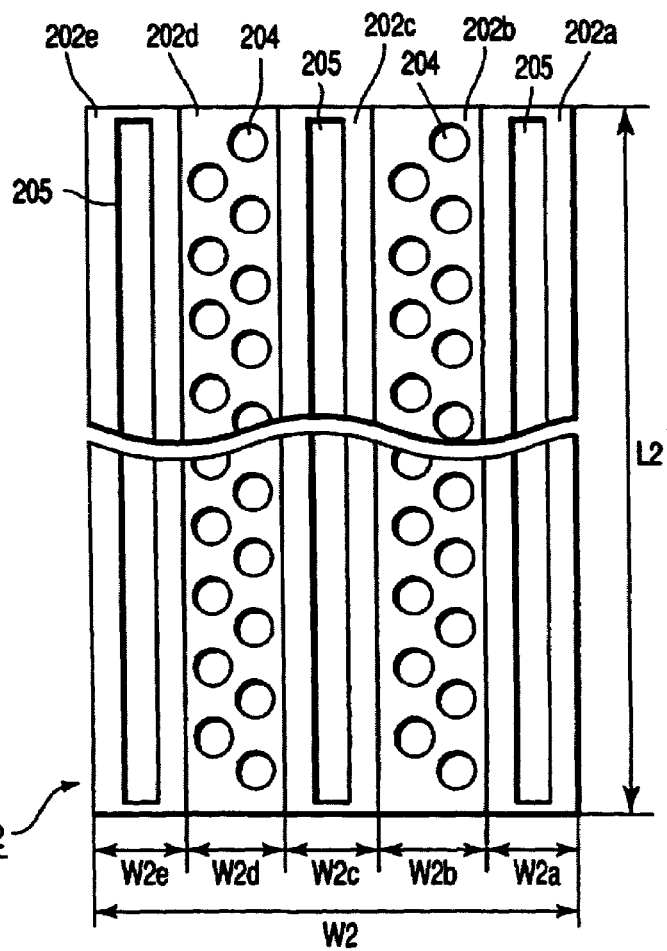
FIG. 7 is a plan view showing a constitution of the nozzle for the cleaning treatment according to the second embodiment.

In the present embodiment, as shown in FIG. 7, the cleaning nozzle 202 is constituted by disposing five nozzles 202a to 202e adjacent to one another and combining the nozzles.

In the present embodiment, three nozzles 202a, 202c, 202e spout the air with the high pressure onto the region to be treated of the substrate 203 as first to third jet regions. Moreover, the nozzles 202b and 202d discharge the cleaning solution to the region to be treated on the substrate 203 as the nozzles for supplying the cleaning solution.

It is to be noted that the nozzles 202a to 202e can be operated to independently discharge or jet out the cleaning solutions A, B, and air with the high pressure.

Here, in the cleaning nozzle 202, the first air supply nozzle 202a, first cleaning solution supply nozzle 202b, second air supply nozzle 202c, second cleaning solution supply nozzle 202d, and third air supply nozzle 202e are disposed in order and adjacent to one another along the scan direction.

Moreover, as shown in FIG. 7, the respective nozzles 202a to 202e are formed in elongated rectangular slit shapes, and a large number of discharge ports of the cleaning solution 204 for discharging the cleaning solution, and a blow-off port for air 205 are formed in the bottom surface disposed opposite to the substrate 203.

Here, the respective cleaning solution supply nozzles 202b, 202d are arranged in parallel in two rows. Moreover, a large number of circular cleaning solution discharge ports 204 are alternately arranged in the bottom surfaces of the respective cleaning solution supply nozzles 202b, 202d in a so-called porous structure. Here, the discharge ports 204 of the cleaning solution are formed in circular shapes, and each cleaning solution can be discharged to the outside with the high pressure. Moreover, the discharge ports 204 of the cleaning solution are alternately arranged in two rows to form the row extending in parallel with each other in the respective cleaning solution supply nozzles 202b, 202d.

In the process of performing the cleaning treatment, the discharge ports 204 of the cleaning solution simultaneously discharge the predetermined cleaning solution, and each of the cleaning solution supply nozzles 202b, 202d can uniformly supply the predetermined cleaning solution to the region to be treated on the substrate 203 in the direction vertical to the scan direction. At this time, as described above, the respective cleaning solution supply nozzles 202b, 202d are arranged in two rows in parallel, and the discharge ports 204 of the cleaning solution are also arranged in two rows in parallel with one another in each nozzle. Therefore, during the scanning, the circular cleaning solution discharge ports 204 discharge the cleaning solution with the high pressure, and can substantially linearly supply the solution to the region to be treated of the substrate 203. A region of the nozzle 202b in which the discharge ports 204 are arranged is a first discharge region. A region of the nozzle 202d in which a plurality of discharge ports 104 are arranged is a second discharge region.

Moreover, the blow-off port for air 205 is formed in the elongated rectangular slit shape in each of the first to third air supply nozzles 202a, 202c, 202e. Thereby, the air with the high pressure can uniformly be spouted to the region to be treated of the substrate 203 continuously without being interrupted in the direction vertical to the scan direction. A region of the first air supply nozzle 202a in which the blow-off port 205 is formed is a third jet region. A region of the second air supply nozzle 202c in which the blow-off port 205 is formed is a first jet region. A region of the third air supply nozzle 202e in which the blow-off port 205 is formed is a second jet region.

As described above, the cleaning nozzle 202 is constituted so that each cleaning solution and air with the high pressure are substantially linearly supplied to the region to be treated of the substrate 203 continuously without being interrupted.

It is to be noted that in the present embodiment each of the bottom surfaces of the nozzles 202a to 202e has a transverse width ($W_{2a}$, $W_{2b}$, $W_{2c}$, $W_{2d}$, $W_{2e}$)=5 mm, and longitudinal length $L_2$=205 mm. Moreover, these five nozzles are integrated and used, and the whole cleaning nozzle 202 includes the structure in which the bottom surface has the dimensions such as a transverse width $W_2$=25 mm and longitudinal length $L_2$=305 mm.

Here, especially the longitudinal length $L_2$ of the cleaning nozzle 202 is set to be larger than the diameter (e.g., 300 mm) of the substrate 203 by about several millimeters, and the cleaning solution and air with the high pressure may securely be supplied over the whole surface of the substrate 203.

Moreover, in the cleaning treatment mechanism for use in the present embodiment, for the constitution of the cleaning nozzle 202, the number and arrangement of nozzles can appropriately be changed. Concretely, the number of the nozzles for supplying the cleaning solution and for supplying the air is changed in accordance with a cleaning purpose, and each constitution and arrangement of the nozzles can be changed.

In the present embodiment, the above-described cleaning treatment mechanism is used to subject the substrate to a cleaning treatment step. In the present embodiment, a substrate treating method will be described in terms of one example of the process of manufacturing the semiconductor device in the same manner as in the first embodiment. In this case, the developing treatment step and then the cleaning treatment step are successively performed so as to form the pattern in the photosensitive photo resist film on the semiconductor substrate. Therefore, the semiconductor substrate is used as one example in the substrate.

It is to be noted that in the present embodiment a semiconductor substrate having a diameter of about 300 mm is used as one example.

Figure 8:
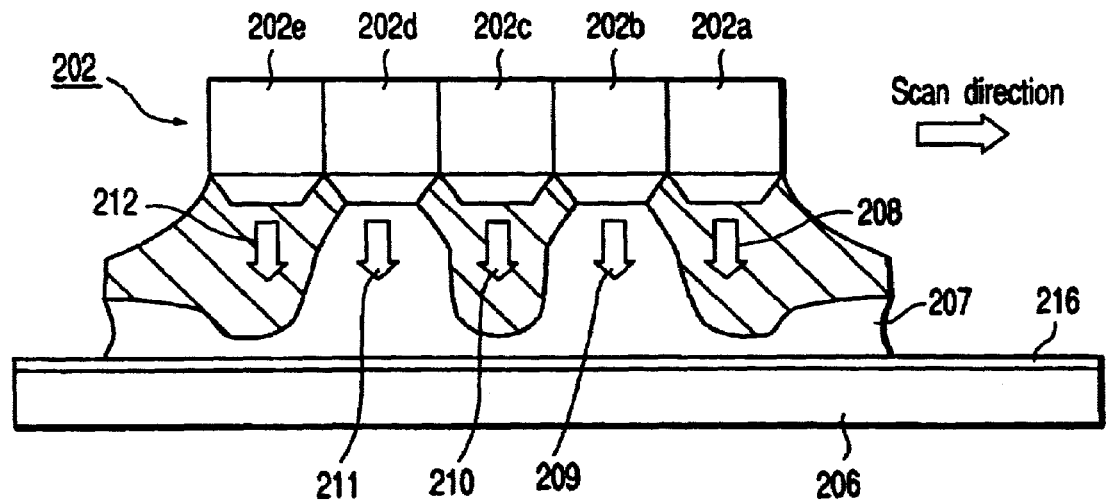
FIG. 8 is a sectional view showing the substrate treating method according to the second embodiment.

The cleaning treatment method of the present embodiment will concretely be described hereinafter with reference to FIG. 8. Here, it is assumed that the treating unit including the cleaning treatment mechanism 200 shown in FIG. 8 is used.

The reflection preventive film is formed beforehand on the semiconductor substrate. Subsequently, the photosensitive photo resist film of the chemical amplification type is successively formed on the film in a known method. Thereafter, the KrF excimer laser is used in the light source to perform the reduced projecting exposure via the reticle for exposure, and the photo resist film is irradiated with the pattern having the predetermined dimension and shape.

Subsequently, the semiconductor substrate including the photo resist film is heat-treated. Thereafter, the above-described movable nozzle for developing is used to perform the so-called scan developing treatment, and the pattern having the predetermined dimension and shape is formed on the photo resist film. Here, while the nozzle for developing is scanned at the constant speed of about 60 mm/sec, the predetermined developing solution is supplied to the photo resist film on the semiconductor substrate, the known paddle developing treatment is performed, and the pattern is formed on the photo resist film.

It is to be noted that an alkaline tetramethylammonium aqueous solution (=pH value: 13.4) is used in the developing solution for the photo resist.

Next, the method comprises: performing the developing treatment for the predetermined time; subsequently subjecting the semiconductor substrate to the cleaning treatment; stopping the development reaction in the photo resist film; and washing away and removing the developing solution, dissolution product generated by the developing treatment, and micro particles to the outside of the semiconductor substrate.

Here, without rotating the substrate as in the related art, the semiconductor substrate set to be in the stationary state on the chuck for fixing/supporting 201 is subjected to the cleaning treatment to remove the developing solution, dissolution product generated by the developing treatment, and micro particles. Thereafter, the drying treatment is performed to form the pattern of the photo resist having the predetermined dimension and shape on the semiconductor substrate.

Thereafter, the cleaning treatment method will concretely be described. In the present embodiment, while the nozzle for cleaning 102 is scanned over the whole surface of the semiconductor substrate, the cleaning treatment is performed to remove the developing solution, dissolution product generated by the developing treatment, and micro particles. It is to be noted that the surface of the semiconductor substrate is a surface in which a semiconductor device is formed.

Concretely, in the same manner as in the first embodiment, first the cleaning nozzle 202 is brought close to one end of a semiconductor substrate 206. Thereafter, while the constant interval is kept from the film of a developing solution 207 on the semiconductor substrate 206, the nozzle is moved and scanned in parallel toward the other end, and the cleaning treatment is performed. At this time, while the cleaning nozzle 202 is scanned, as shown in FIG. 8, three air supply nozzles 202a, 202c, 202e, and two cleaning solution supply nozzles 202b, 202d supply high-pressure dry airs 208, 210, 212, cleaning solution A 209, and cleaning solution B 211 to the developing solution 207 as one example. It is to be noted that reference numeral 216 denotes the photo resist film.

In the present embodiment, as described above, for the cleaning nozzle 202, the longitudinal length $L_2$ (e.g., 305 mm) is not less than the diameter (e.g., 300 mm) of the semiconductor substrate 206. Moreover, the width of the direction crossing at right angles to the scan direction of the region in which the dry airs 208, 210, 212 and cleaning solutions 209, 211 are supplied is not less than the diameter of the semiconductor substrate 206. Therefore, the dry airs 208, 210, 212 and cleaning solutions 209, 211 are supplied to the whole surface of the semiconductor substrate 206 in the constitution. Therefore, while the high-pressure dry airs 208, 210, 212 are spouted, and the cleaning nozzle 202 is scanned as described above, the cleaning solution A 209 and cleaning solution B 211 are supplied to the whole surface of the semiconductor substrate 203.

In the present embodiment, the respective air supply nozzles 202a, 202c, 202e spout the high-pressure dry airs 208, 210, 212 as one example. Moreover, in the present embodiment, as one example, the ozone water which is an oxidizing cleaning solution is used in the cleaning solution A 209. Moreover, the hydrogen water which is a reducing cleaning solution is used in the cleaning solution B 211. At this time, the concentrations of the ozone water and hydrogen water are set to about 0.1 to 5 ppm.

Moreover, as shown in FIG. 8, each of the high-pressure dry airs 208, 210, 212 functions as the so-called air curtain. The high-pressure dry airs 208, 212 are spouted to the film of the developing solution 207 on the semiconductor substrate 206 to flow over the cleaning solution A 209 discharged from the nozzle 202b and the cleaning solution B 211 discharged from the nozzle 202d from opposite sides of the cleaning nozzle 202 in the scan direction, and function so as to block these solutions from the outside. Moreover, the high-pressure dry air 210 slightly blocks between the cleaning solution A 209 and cleaning solution B 211 with respect to the film of the developing solution 207 on the semiconductor substrate 206 in a thickness of about several hundreds of nanometers to several hundreds of micrometers to such an extent that the solution film is left.

In this case, the high-pressure dry airs 208, 210, 212 are spouted at a wind velocity of about 0.1 to 10 m/sec, and each air requires the pressure and flow rate to such an extent that the air functions as the air curtain.

Moreover, at this time, the cleaning nozzle 202 is brought close to a height of 3 mm or less from the surface of the developing solution 207 on the semiconductor substrate 206, and the constant interval is kept to such an extent that the nozzle does not contact the pattern on the photo resist. Thereafter, while the cleaning solution A 209, cleaning solution B 211, and high-pressure dry airs 208, 210, 212 are supplied from the cleaning nozzle 202 as described above, the nozzle is scanned over the whole surface of the semiconductor substrate 206 from one end to the other end of the semiconductor substrate 206. Therefore, the high-pressure dry air 208, cleaning solution A 209 (e.g., ozone water), high-pressure dry air 210, cleaning solution B 211, and high-pressure dry air 212 are supplied in order in the region to be treated on the semiconductor substrate 206.

In the present invention, as one example, the cleaning nozzle 202 is scanned on the same path in the same direction as those of the nozzle for developing, which supplies the developing solution 207. Moreover, at this time, the cleaning nozzle 202 is scanned at the constant speed of about 60 mm/sec which is the same as the movement speed of the nozzle for supplying the developing solution 207.

In this case, since the nozzle is scanned at the substantially same constant speed in the same direction on the same path, as compared with the supply of the developing solution 207, the time from when the developing solution 207 is supplied to the whole surface of the semiconductor substrate 206 until the solution is replaced with the cleaning solution A 209 can be controlled to be equal. Therefore, the difference is generated in the time to start the development reaction between the regions in the process of forming the pattern in the photo resist film. However, the time for which the developing solution functions in the whole surface of the semiconductor substrate 206 is set to be equal, and it is possible to form the pattern in the photo resist film with good precision.

It is to be noted that in the present embodiment the replacement of the developing solution with the cleaning solution indicates that the components of the developing solution are changed by the components of the cleaning solution, and the function of the developing solution onto the photo resist is stopped.

Moreover, at this time, the cleaning solution (e.g., pure water) is discharged from the nozzle (not especially shown) for cleaning the above-described back surface, and the cleaning treatment of the back surface of the semiconductor substrate 206 is performed. In this manner, when the front surface of the semiconductor substrate is cleaned, the back surface is cleaned. Thereby, the developing solution, dissolution product, and micro particles removed from the front surface of the semiconductor substrate 206 can securely be discharged without being left in the semiconductor substrate. Furthermore, when the front and back surfaces are simultaneously cleaned/treated, it is possible to securely perform the cleaning treatment of the semiconductor substrate 206 in short time.

The cleaning treatment is performed as described above, successively the airs are supplied to the surface of the semiconductor substrate 206, and the cleaning solution slightly left on the pattern of the photo resist film is removed. In this manner, in the present embodiment, the cleaning solution is vaporized without rotating the semiconductor substrate 206, and the drying treatment can be performed. Therefore, even when the semiconductor substrate having a large bore diameter (e.g., 300 mm) is used, the drying treatment can be performed without damaging the pattern of the photo resist, or causing the pattern fall.

It is to be noted that in the present embodiment the cleaning nozzle 202 is relatively moved with respect to the substrate, that is, the semiconductor substrate 106, and the respective cleaning solutions and high-pressure dry air may be supplied. Therefore, it is also possible to fix the cleaning nozzle 202, discharge the respective cleaning solutions in this state, move the semiconductor substrate 206 including the chuck for fixing/supporting 201, and supply the respective cleaning solutions 209, 211, and high-pressure dry airs 208, 210, 212 to the region to be treated on the semiconductor substrate 106 as described above.

The cleaning method of the present embodiment comprises: discharging or spouting the high-pressure dry air 208, cleaning solution A 209, high-pressure dry air 210, cleaning solution B 211, and high-pressure dry air 212 to the developing solution 207 on the substrate, that is, the semiconductor substrate 206 in order along the scan direction. The effect is as follows.

When the first air supply nozzle 202a spouts the high-pressure dry air 208 in the cleaning nozzle 202, the developing solution 207 on the semiconductor substrate 206 is pressurized, and the film thickness is reduced to about several hundreds of micrometers.

At this time, the high-pressure dry air 208 forms the air curtain, and prevents the developing solution 207 from sticking to the region subjected to the cleaning treatment again. Additionally, the cleaning solution A 209 supplied soon after the developing solution is effectively prevented from going ahead, that is, sticking to the region which has not been cleaned.

Moreover, the first cleaning solution supply nozzle 202b of the cleaning nozzle 202 discharges the cleaning solution A 209. The developing solution 207 on the semiconductor substrate 206 is replaced with the component of the cleaning solution A 209. Furthermore, the cleaning solution A 209 washes away the dissolution product and micro particle in the solution to the outside of the semiconductor substrate 206.

At this time, the first air supply nozzle 202a spouts the high-pressure dry air 208, the film thickness of the developing solution 207 on the semiconductor substrate 206 is reduced as described above, and the amount of the developing solution 207 decreases and is pressurized. Therefore, the cleaning effect is enhanced.

Furthermore, the second air supply nozzle 202c spouts the high-pressure dry air 210. The region below the first cleaning solution supply nozzle 202b is partitioned by the air curtain on opposite sides, and blocked in the scan direction. Therefore, a region in which the cleaning solution A 209 functions is limited to the region partitioned by the high-pressure dry airs 208, 210. The film thickness of the developing solution 207 in the region is reduced as described above. Additionally, the amount of the solution is sufficiently reduced as compared with the cleaning solution A 209. In this case, the amount of the cleaning solution A 209 consumed by the developing solution 207 decreases in the process of performing the cleaning treatment, and it is possible to keep the concentration to be substantially constant from a supply time. Therefore, the cleaning nozzle 202 is scanned, thereby the developing solution 207 is momentarily replaced with the cleaning solution A 209 (e.g., ozone water), and it is possible to perform the cleaning treatment in the whole surface of the semiconductor substrate 206 in short time.

Moreover, the developing solution 207 and cleaning solution replaced with the cleaning solution A 209 are discharged to the outside of the semiconductor substrate 206 from a gap along the air curtain. After the cleaning nozzle 202 is scanned, the developing solution 207 can be prevented from returning onto the substrate.

Additionally, at this time, the high-pressure dry airs 208, 210 need to be linearly connected to form the air curtain without being interrupted in a direction substantially vertical to a direction in which the semiconductor substrate 206 is scanned.

In the cleaning solution supply nozzle 202, subsequent to the high-pressure dry air 210, the cleaning solution B 211, and high-pressure dry air 212 are successively discharged or spouted.

In the present embodiment, the ozone water is used in the cleaning solution A 209. This ozone water oxidizes the dissolution product generated in the process of performing the developing treatment, micro particles, and deposits. Especially there is an effect that the organic matter is oxidized and the molecular structure is decomposed and finely divided into particles. Therefore, after the developing treatment, the organic matter is inhibited from sticking to the photo resist against, and the generation of the defect portions of the resist pattern can largely be reduced.

Moreover, at this time, the ozone water may be used in low concentration of about 1 ppm. With this degree of concentration, the ozone water does not damage the pattern of the photo resist. In this case, since only the side wall portion of the pattern of the photo resist is slightly etched, the roughness (=local dispersion) of the dimension of the resist pattern is reduced. An effect is obtained that the dimensional uniformity is enhanced in the plane.

Furthermore, as described above, in the present embodiment, the hydrogen water which is the cleaning solution having the reducing property is used in the cleaning solution B 211.

After the organic matter is decomposed by the ozone water as described above, the particles of the organic matter left without being washed away stick to the surface of the photo resist film. When the particles of the organic matter stick to the pattern of the photo resist, the defect portion (=dispersion of the pattern dimension) is generated in the resist pattern, and the errors of the dimension and shape are generated in the subsequent etching step.

To solve the problem, as in the present embodiment, after the ozone water is supplied, the hydrogen water is discharged. Thereby, the surfaces of the particles of the organic matter are reduced, and are separated from the surface of the photo resist film again. Thereby, additionally, the contaminants and impurities are washed away to the outside of the semiconductor substrate 206, and the cleaning treatment can further securely be performed.

In the present embodiment, the ozone water is used in the cleaning solution A 209, the hydrogen water is used in the cleaning solution B 211, and these are continuously supplied to the developing solution 207 on the semiconductor substrate 206. In this case, the ozone water is the oxidizing aqueous solution, whereas the hydrogen water is the reducing aqueous solution. When the ozone and hydrogen waters are mutually mixed in the process of performing the cleaning treatment, the properties of the solutions are mutually offset, and the function of the cleaning solution, and the cleaning effect are deteriorated.

Therefore, when the cleaning solutions having the opposite properties are used, in the same manner as in the first embodiment, the dry air with the high pressure is spouted so as to separate both the cleaning solutions, and the so-called air curtain is formed between the solutions to inhibit the cleaning solutions from being mixed. This is effective in keeping the cleaning effect to be constant and high.

It is to be noted that in the present embodiment the ozone water is used in the cleaning solution A, and the hydrogen water is used in the cleaning solution B. However, as long as the effects similar to these can be obtained, it is possible to change the cleaning solution to another type. For example, the ozone water is used in the cleaning solution A, the pure water is used in the cleaning solution B, and the cleaning treatment can be performed as described above. Moreover, the surfactant is added to the pure water for use in the cleaning solution B, and the impurities and contaminants can more effectively be removed.

In the present embodiment, as described above, while the cleaning solution A 209 and cleaning solution B 211 are discharged, the high-pressure dry airs 208, 212 are spouted on opposite sides before/after the solutions, and the cleaning treatment is performed in this manner. At this time, the high-pressure dry airs 208, 212 function as the air curtain, and block the cleaning solution A 209 and cleaning solution B 211 from the front/back side in the scan direction of the cleaning nozzle 202. Therefore, the cleaning solution A 209 and cleaning solution B 211 are not diffused to the outside, and are supplied to the developing solution 207 in a concentrated manner, so that the pressure increases and the cleaning effect can further be enhanced the more.

The effect of the present embodiment will be compared with that of the use of the related-art cleaning method, and described hereinafter with reference to FIGS. 9A, 9B.

Here, the method comprises: first scanning the nozzle for cleaning for use in the present embodiment as described above; supplying the air, ozone water, air, hydrogen water, and air in order as one example; carrying out the cleaning treatment of the substrate; and thereafter measuring dimensional uniformity and the number of defect portions of the photo resist pattern. Moreover, here, in the same manner as in the first embodiment, the method comprises: repeating the cleaning treatment about three times in one example; and measuring the dimensional uniformity in the substrate plane and the number of defect portions of the pattern in each treatment. FIGS. 9A, 9B show the results of three cleaning treatments using the present-embodiment method, and related-art cleaning method. The effect of the present embodiment is considered by comparing the average value of three cleaning treatments with the value of the related-art cleaning method. As a result, it has been found that the effects shown in FIGS. 9A, 9B are obtained in the present embodiment.

Figure 9A:
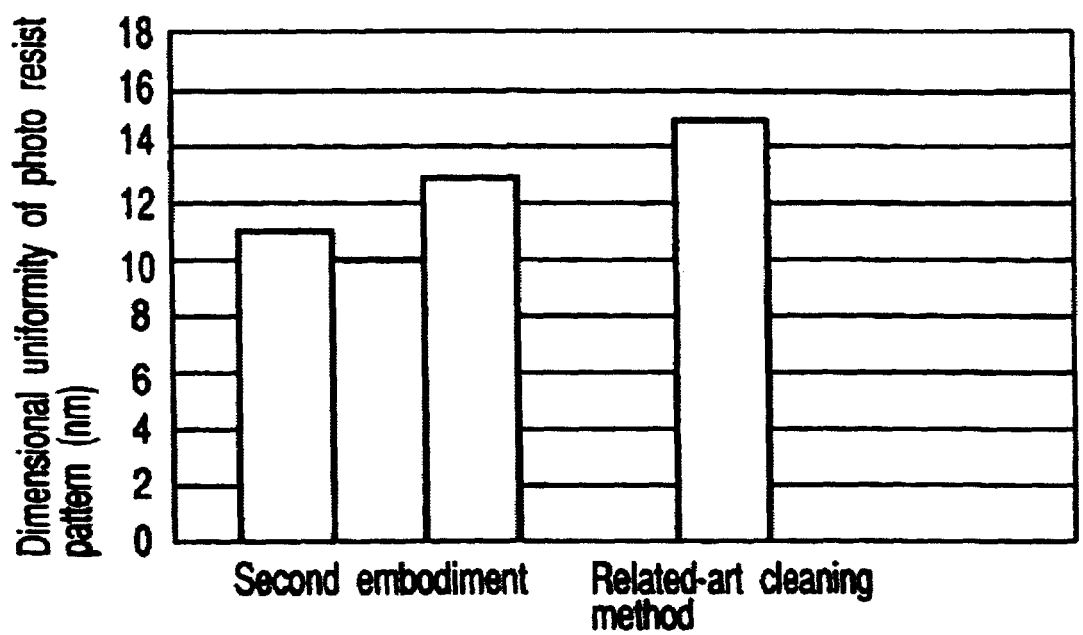
FIGS. 9A, 9B are diagrams showing the effect of the second embodiment.

FIG. 9A shows the results of measurement of the dimensional uniformity of the photo resist pattern in the plane of the substrate (=wafer) in each of the present-embodiment method and related-art cleaning method. In the method according to the present embodiment, as shown in FIG. 9A, in the same manner as in the first embodiment, the dimensional uniformity can be enhanced by about 20% as compared with the related-art cleaning method. Here, the dimensional uniformity indicates the degree of dispersion of dimension obtained as a result of measurement performed in a plurality of points of the patterns using the patterns which have to have the same dimension in the design as the objects.

Figure 9B:
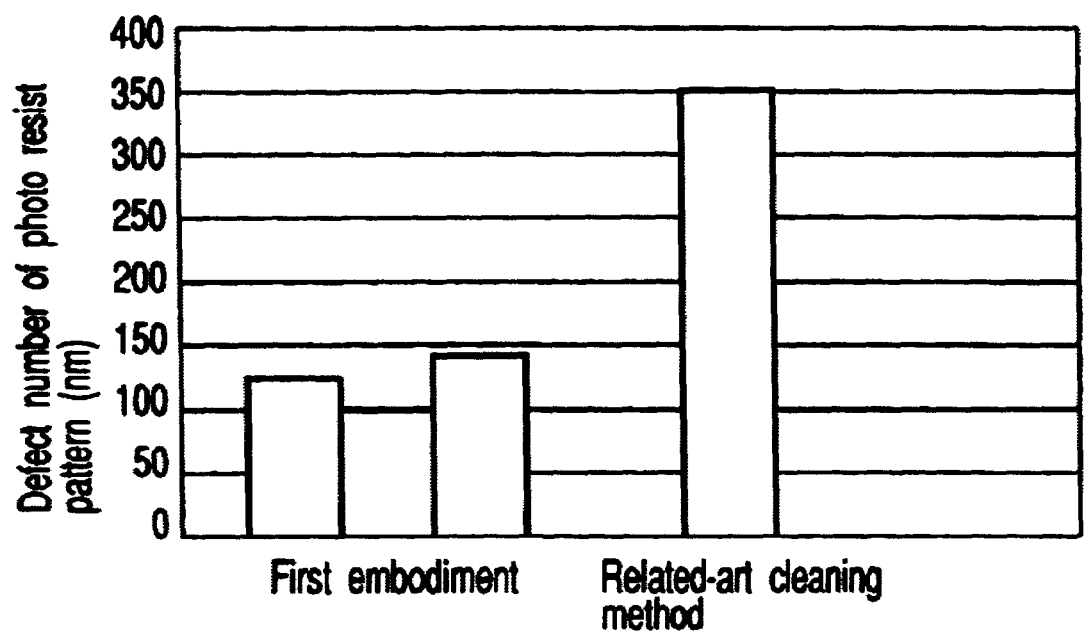

Moreover, FIG. 9B shows the results of the measurement of the number of defect portions generated in the photo resist pattern in each of the present-embodiment method and related-art cleaning method. In the present embodiment, as shown in FIG. 9B, in the same manner as in the first embodiment, as a result of the measurement of the number of defect portions of the photo resist pattern on the substrate, the number can be decreased by 65% as compared with the use of the related-art cleaning method. Here, the defect portion indicates the state in which the impurities and contaminants of the organic matters stick to the photo resist pattern and the error is generated in the dimension.

In this manner, the present embodiment relates to the semiconductor substrate which has a large bore diameter (e.g., diameter of about 300 mm). Additionally, it is possible to enhance the cleaning effect in the developing treatment of the photo resist as compared with the related-art cleaning method.

Figure 10:
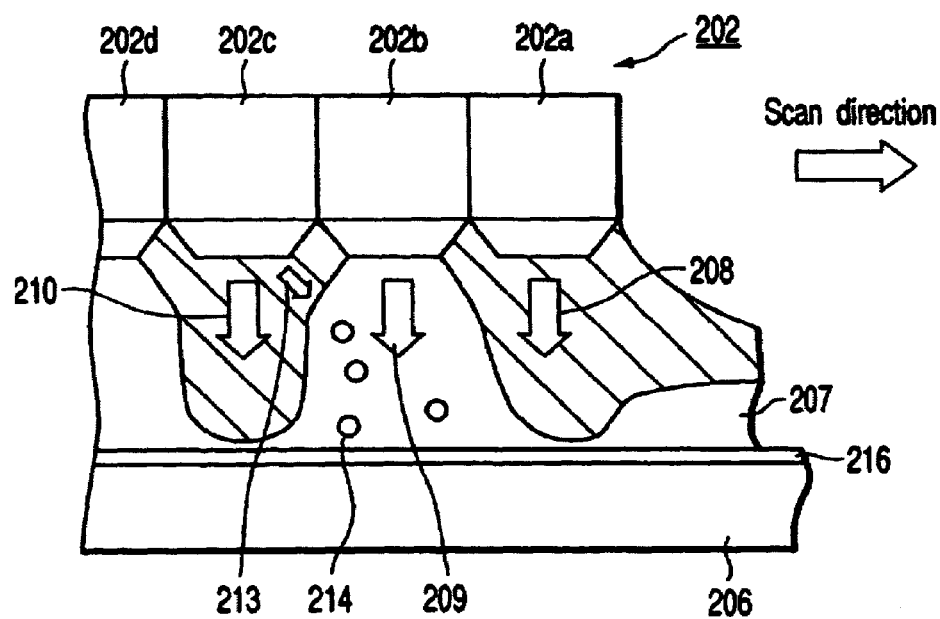
FIG. 10 is a sectional view showing the substrate treating method according to the second embodiment.

In the present embodiment, it is also possible to generate bubbles inside the cleaning solution, allow the bubbles to physically function, and further enhance the cleaning effect. In this case, as shown in FIG. 10, a part (=small air) 213 of the high-pressure dry air 210 spouted from the second air supply nozzle 202c is mixed in the cleaning solution A 209 discharged from the nozzle 202b before reaching the developing solution 207 on the semiconductor substrate 206 in the region partitioned by the air curtains 208, 210 on the opposite sides, and bubbles 214 can be generated in the cleaning solution A 209. The bubbles 214 generate a pressure difference inside the cleaning solution A 209, give impact to the dissolution product and micro particles sticking to the surface of the pattern of the photo resist, easily remove these, and can further enhance the cleaning effect.

In this case, in the cleaning nozzle 202, at least a nozzle can be used which is processed so as to spout a part of one of the high-pressure dry airs 208, 210 toward the adjacent cleaning solution A 209.

Concretely, the nozzle is processed such that the air blow-off ports 205 of the nozzles 202a, 202c spout the high-pressure air to form the air curtain on the opposite sides of the first cleaning solution supply nozzle 202b and at least a part of the high-pressure dry air 208 or 210 is spouted toward the adjacent cleaning solution A 209. Here, in at least one of the nozzles 202a, 202c, a blow-off port (e.g., hole shape) is disposed in the vicinity of the nozzle 202b at a predetermined interval from the air blow-off port 205, and a part of the high-pressure dry air 208 or 210 is spouted in the constitution.

It is to be noted that as one example, the bubbles are generated in the cleaning solution A 209 to perform the cleaning treatment. However, the cleaning nozzle 202 is similarly processed, and the bubbles can be generated in the cleaning solution B 211 in order to perform the cleaning treatment. Moreover, as in the present embodiment, each of the high-pressure dry airs 208, 210, 212 functions, and the amount of the developing solution 207 is reduced to a slight amount on the semiconductor substrate 206. In this case, the cleaning solution A 209, that is, the ozone water reaches the photo resist film during the development reaction without dropping in the concentration in the solution, and a surface layer portion is brought in an oxidized state by the ozone water.

When even the surface layer portion of the photo resist film is oxidized in this manner, the particles of the organic matter can further securely be prevented from sticking again. Therefore, in the present embodiment, the dissolution product, micro particle, deposit, and especially organic matter are effectively removed. In the process of performing the cleaning treatment, it is possible to remarkably reduce the generation of the defect portion of the developed pattern.

Moreover, in the present embodiment, the high-pressure dry airs 208, 210, 212 are spouted, thereby the films of the cleaning solution A 209 and cleaning solution B 211 are pressurized, and the thickness can be reduced to about several hundreds of nanometers to several tens of micrometers right under the air curtain. That is, the cleaning solution A 209 and cleaning solution B 211 are reduced to the slight amount in the region in which the high-pressure dry airs 208, 210, 212 have passed in the semiconductor substrate 206. Therefore, thereafter, without throwing off the cleaning solution by the high-speed rotation (=rotation speed: about 1000 to 4000 rpm) as in the related-art method, at least the substantially equal effect of the drying treatment can be given to the semiconductor substrate 206. In this case, since the physical load (=e.g., the centrifugal force, water current of the cleaning solution, and the like) is not applied to the semiconductor substrate 206, even with the use of the semiconductor substrate having a large bore diameter (e.g., the diameter of about 300 mm), it is possible to easily impart the drying effect to the pattern of the photo resist without damaging the pattern after the cleaning treatment.

In this manner, the present embodiment relates to the semiconductor substrate which has a large bore diameter (e.g., the diameter of about 300 mm). Additionally, it is possible to obtain the equal or more cleaning effect as compared with the related-art method, that is, the high-speed rotating and cleaning of the semiconductor substrate.

Figure 31:
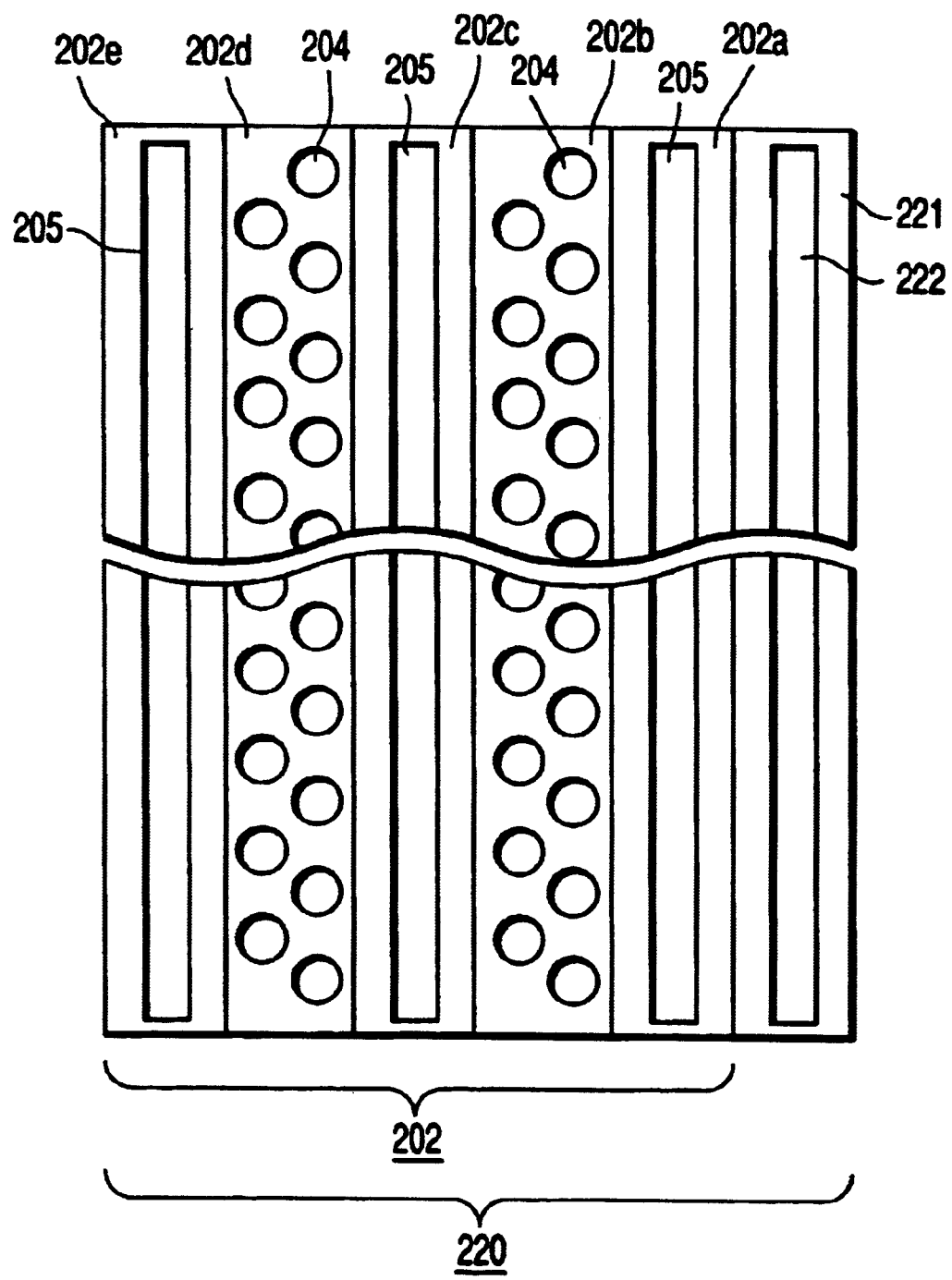
FIG. 31 is a plan view showing the constitution of the nozzle for treating the substrate according to the second embodiment.

It is to be noted that a nozzle 220 integrally constituted of the nozzle for cleaning 202 and nozzle for developing 221 shown in FIG. 31 may also be used. As shown in FIG. 31, the nozzle 220 includes the nozzle for cleaning 202 and nozzle for developing 221. A discharge port 222 for discharging the developing solution is formed in the slit shape in the nozzle for developing 221. The length of the direction of the discharge port 222 crossing at right angles to the scan direction is equal to or more than the maximum diameter or longest side of the substrate. Thereby, the developing solution can uniformly be supplied to the region to be treated of the substrate continuously without being interrupted in the direction substantially vertical to the scan direction. It is to be noted that the discharge port 221 forms the third discharge region. It is to be noted that the position of the nozzle for developing 221 is not limited to the front side of the nozzle for cleaning 202 with respect to the scan direction as shown in FIG. 31. For example, the nozzle for developing 121 may also be disposed on the rear side of the nozzle for cleaning 202 with respect to the scan direction.

With this nozzle, the developing treatment is not performed in parallel with the cleaning treatment. At the developing treatment time, the nozzle for developing 221 discharges the developing solution, and the nozzle for cleaning 202 does not discharge the cleaning solution or jet out the gas. Moreover, at the cleaning treatment time, the nozzle for cleaning 202 discharges the cleaning solution and jets out the gas, and the nozzle for developing 221 does not discharge the developing solution.

As described above, in the first and second embodiments, as compared with the related-art cleaning method, it is possible to effectively perform the cleaning treatment of the substrates such as the semiconductor substrate.

In the above, the semiconductor substrate has been described as one example of the substrate in the manufacturing steps of the semiconductor device in the first and second embodiments. However, in these embodiments, even with the use of the other substrates such as a substrate for liquid crystal and mask substrate for exposure, the present invention is applied to the developing and cleaning treatments, and it is possible to enhance yield of each type of product.

THIRD EMBODIMENT

Figure 11:
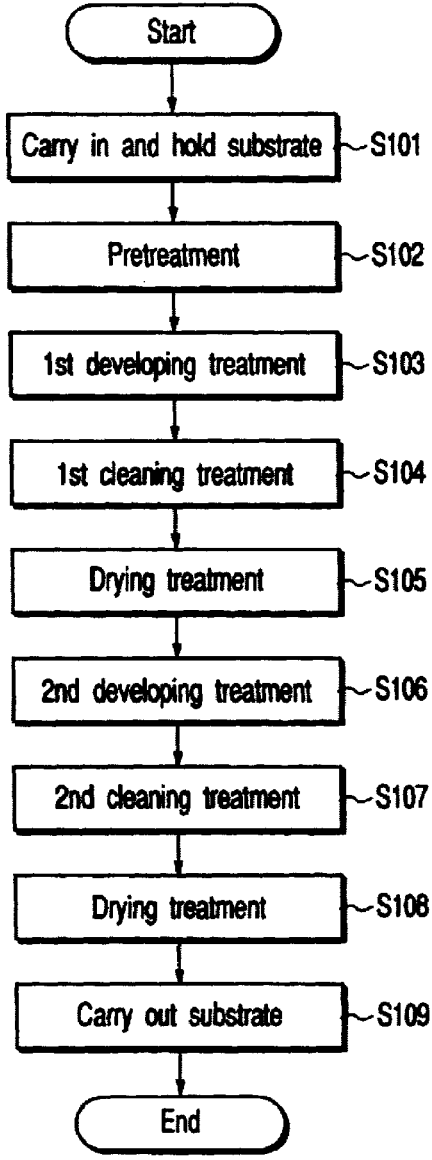
FIG. 11 is a diagram showing a flowchart of a treating procedure of a developing treatment method according to a third embodiment.

FIG. 11 is a diagram showing a flowchart of a treating procedure of the developing treatment method according to a third embodiment of the present invention. Moreover, FIGS. 12 to 16 are process diagrams showing the treating procedure of the developing treatment method according to the third embodiment of the present invention.

A developing method according to the third embodiment of the present invention will be described with reference to FIGS. 11 to 16.

(Step S101)

Figure 12:
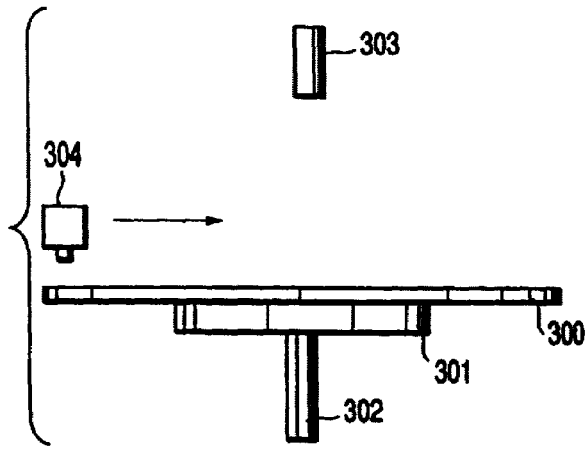
FIG. 12 is a process diagram showing the developing treatment method according to the third embodiment.

As shown in FIG. 12, a main surface of a substrate 300 including the semiconductor substrate is coated with the resist of the chemical amplification type (photosensitive resist film) via the reflection preventive film, and KrF excimer laser is used in the chemical amplification type resist film to reduce/project/expose a circuit pattern via a reticle for exposure. The substrate 300 is subjected to PEB treatment. Subsequently, a transfer robot transfers the substrate 300 into an upper part of a substrate holding portion 301 of a developing apparatus, and the substrate is sucked and fixed onto the substrate holding portion 301. At a rinsing time, and drying time, a rotation mechanism 302 rotates the substrate 300 if necessary.

The developing apparatus according to the present embodiment further includes a rinse nozzle 303, developing solution supply nozzle 304, and scan mechanism for scanning the developing solution supply nozzle 304 from one end toward the other end of the substrate 300. The rinse nozzle 303 discharges solutions having an oxidizing property or weak alkali solutions, such as high-purity water, ozone water, and oxygen water via the discharge port at a rinse time of the substrate 300 or at a development stop time. The developing solution supply nozzle 304 has a side longer than the longest diameter of the substrate 300 and uniformly supplies the developing solution to the substrate 300. It is to be noted that the rinse nozzle preferably includes: a mechanism for rocking the discharged cleaning solution; and an alleviation mechanism which inhibits a force of the cleaning solution from being locally strengthened inside the nozzle discharge port, in order to prevent the photosensitive resist of the substrate main surface from being damaged by the discharged oxidizing solution or weak alkali solution, and allow the cleaning solution to uniformly function on the substrate.

(Step S102)

Figure 13A:
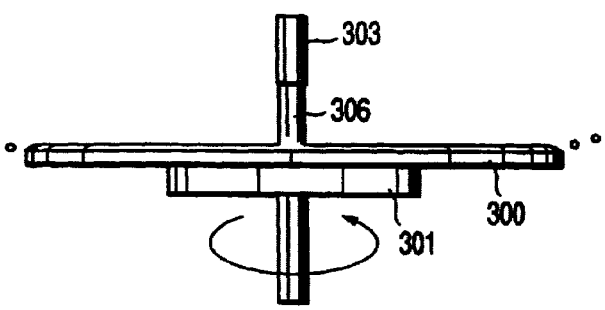
FIGS. 13A, 13B are process diagrams showing the developing treatment method according to the third embodiment.
Figure 13B:
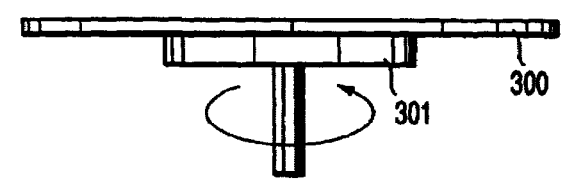

Next, as shown in FIG. 13A, the rinse nozzle 303 is moved to a predetermined height from the substrate 300. While the substrate 300 is rotated by a rotation mechanism 302, an ozone water 306 having an ozone concentration of 5 ppm or less is discharged as a pretreatment solution to the substrate 300 from the rinse nozzle 303 for about two seconds. During this, the rinse nozzle 303 moves on the main surface of the substrate 300, rocks the ozone water 306, and supplies the water onto the substrate 300 main surface as uniformly as possible. Subsequently, as shown in FIG. 13B, the substrate 300 is rotated, and the substrate 300 surface is dried.

Here, a pretreatment step is performed so as to uniformly form the solution film on the substrate, but this pretreatment step is not necessarily required. Moreover, an oxygen water, hydrogen water, nitric acid, oxygenated water, and alkali ion water may also be used as the pretreatment solution as long as the solution film can more uniformly be formed than by the ozone water.

(Step S103)

Figure 14A:
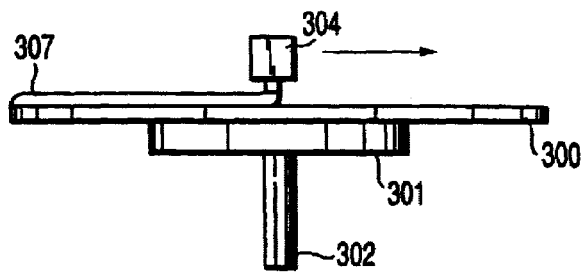
FIGS. 14A, 14B are process diagrams showing the developing treatment method according to the third embodiment.
Figure 14B:
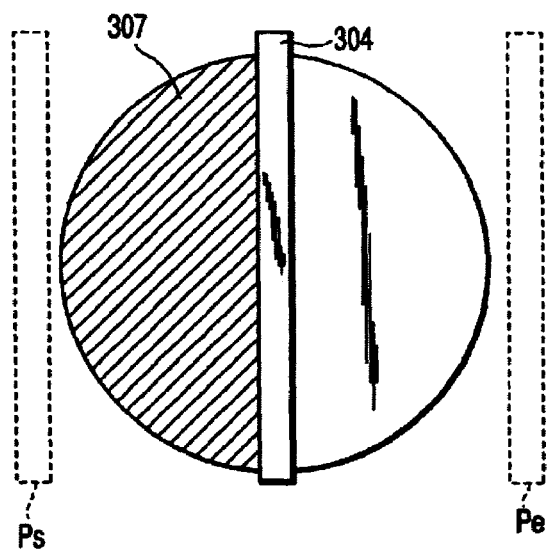

Subsequently, as shown in FIGS. 14A, 14B, as a first developing treatment, the film of the developing solution which processes the photosensitive resist film on the substrate 300 is formed on the substrate 300. Here, the linear developing solution discharge nozzle 304 is scanned from one end to the other end of the substrate 300, a developing solution 307 is discharged in a curtain shape, and a developing solution film 307 is formed on the substrate 300. As shown in FIG. 14B, since the length of the developing solution supply nozzle 304 in a direction vertical to the scan direction is longer than the diameter of the substrate 300, the film of the developing solution 307 can be formed on the whole surface of the substrate 300.

Figure 15A:
FIGS. 15A, 15B are process diagrams showing the developing treatment method according to the third embodiment.
Figure 15B:
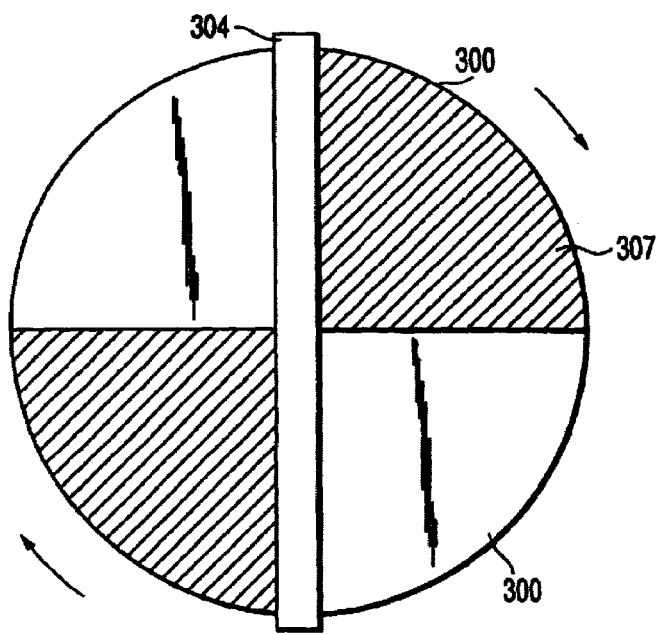

A developing solution film forming step is not limited to the method described herein. For example, as shown in FIGS. 15A, 15B, there is a method comprising: supplying the developing solution from the linear developing solution supply nozzle 304 while rotating the substrate 300 to form the developing solution film 307 in the whole surface of the substrate 300. FIG. 15 is a diagram showing a modification example of the developing solution film forming method according to the third embodiment of the present invention. FIG. 15A is a sectional view, and FIG. 15B is a plan view.

Figure 16A:
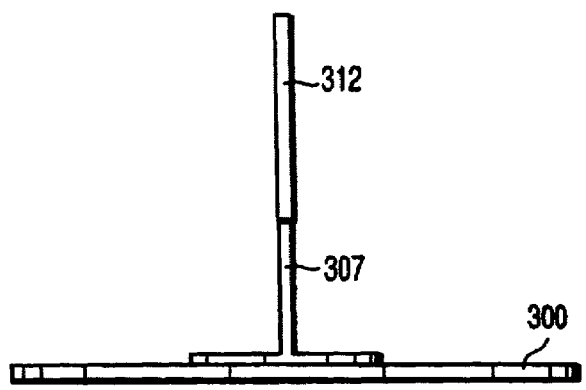
FIGS. 16A, 16B are process diagrams showing the developing treatment method according to the third embodiment.
Figure 16B:
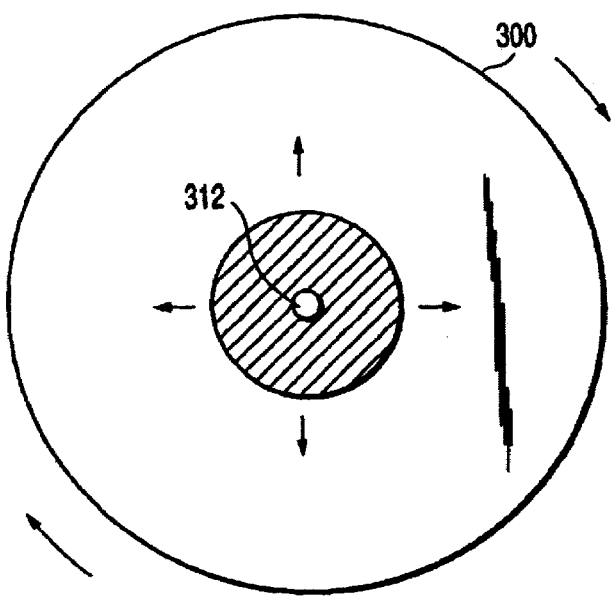

Moreover, as shown in FIGS. 16A, 16B, there is a method comprising: supplying the developing solution 307 to the substrate 300 from a straight tubular nozzle 312 while rotating the substrate 300 to form the developing solution film 307 in the substrate 300 whole surface. In addition to the methods described herein, various modes may be used. FIGS. 16A, 16B are diagrams showing the modification example of the developing solution film forming method according to the third embodiment of the present invention. FIG. 16A is a sectional view, and FIG. 16B is a plan view.

(Step S104)

A first cleaning treatment comprises: discharging the pure water from the rinse nozzle 303 in about five seconds after the developing solution film is formed in the substrate main surface and simultaneously rotating the substrate; and washing away the developing solution film from the substrate 300. Subsequently, while rotating the substrate 300 at a low speed, the low-concentration ozone water was discharged.

(Step S105)

Subsequently, the substrate 300 was rotated at the high speed, and the substrate 300 surface was dried.

The method may also comprise: discharging the low-concentration ozone water from the rinse nozzle 303 and simultaneously rotating the substrate; cleaning the substrate by the low-concentration ozone water for about ten seconds; substantially rotating the substrate at the high speed; and drying the substrate.

In the present embodiment, as the cleaning solution having the oxidizing property, the ozone water was used having the low concentration to such an extent that the resist does not suffer a damage not less than an allowable range. If the similar effect is produced, the oxygen water obtained by dissolving oxygen in the pure water may also be used as the cleaning solution having the oxidizing property. Furthermore, if the similar effect is produced, and the resist does not suffer the damage not less than the allowable value, the weak alkali aqueous solution may also be used.

(Step S106)

Next, a second developing treatment comprises: forming the developing solution which processes the resist film on the substrate 300 on the substrate 300. Here, the method comprised: scanning the linear developing solution discharge nozzle from one end to the other end of the substrate; and discharging the developing solution in the curtain form to form the developing solution film on the substrate.

The developing solution may also be agitated on the substrate main surface in the middle of the second developing treatment if necessary. In this case, examples of an agitating method of the formed developing solution film include: a method of disposing a rectifier plate on the substrate and rotating the rectifier plate to generate an air current; a method of rotating the substrate itself; and a method of vibrating the solution by an vibrator from the outside. Any method may also be used if there is a function of fluidizing the developing solution in the substrate whole surface.

(Step S107)

A second cleaning treatment comprised: discharging the pure water from the rinse nozzle 303 in about 25 seconds after forming the developing solution film in the substrate 300 main surface while rotating the substrate 300 at 500 rpm. It is to be noted that the pure water was used as the cleaning solution after the second development in the present embodiment. However, if a higher cleaning effect is produced any cleaning solution may also be used such as a reducing solution, oxidizing solution (ozone water, oxygen water), weak alkali ion water, slightly acidic ion water, supercritical water, carbonated water, hydrogen water, and pure water. Moreover, it is also possible to appropriately combine these solutions if the cleaning effect is raised.

(Steps S108, S109)

After rotating the substrate at the high speed and drying the substrate, the developing step is ended and the substrate is recovered by the transfer robot.

A problem and cause of the related-art developing method will be described. For the photosensitive resist of the chemical amplification type, a fine alkali soluble region and alkali hardly soluble region are formed in the resist film by exposure and heat treatment of a desired pattern. When these alkali soluble and alkali hardly soluble regions contact the alkali developing solution, the alkali soluble region is dissolved in alkali and the alkali hardly soluble region is not dissolved in a time required for a conventional developing step of a usual KrF resist. The reaction product generated from the alkali soluble region during the development is held between the resist patterns which are alkali hardly soluble region, receives interaction among molecules from the resist hardly soluble region and similarly dissolved reaction product, and remains in position. Especially, when the processed dimension becomes fine, the resist pattern dimension also becomes fine. Therefore, the dimensions of the alkali soluble and hardly soluble regions are also reduced, the interaction among the molecules becomes strong, and the molecules are not easily diffused into the atmosphere in the solution. Moreover, a binding force acts so that the reaction product remains in position by an electrostatic potential from the substrate even after the dissolution. As a result, alkali ions are inhibited from being further diffused into the soluble resist region, alkali concentration differs with positions in the vicinity of the resist surface, the development is inhibited, and the developing rate changes with the positions.

The developing solution was unmovably mounted on the substrate, the developing solution on the substrate was replaced with the cleaning solution (pure water) immediately after elapse of a predetermined time, and the development was stopped. In this method, local retention of the reaction product occurs in the substrate plane as described above, and the product is not removed until the development ends. Therefore, the development is inhibited, and a difference is generated in the developing rate in the plane. Since the developing rate changes especially in accordance with the amount of the reaction products, the amount of generated reaction products differs in coarse and dense regions of the pattern. This causes a phenomenon in which the alkali ion concentration differs in the vicinity of the resist in the pattern coarse and dense regions. That is, a phenomenon occurs in which the developing rate differs in the vicinity of the resist surface in the pattern coarse and dense regions. As a result, a problem of coarse/dense difference of the dimension is generated in the resist pattern.

To solve the problem, a method has been considered comprising: removing the reaction product once in the middle of the development and using a fresh developing solution to perform the development again. However, the method of performing the development in two divided steps is a known technique, and this is described, for example, in Jpn. Pat. Appln. KOKAI Publication No. 2-46464. In the Jpn. Pat. Appln. KOKAI Publication No. 2-46464, after the development is performed with the developing solution once, the rinsing/drying is performed, and the development is performed again in the highly dense developing solution. The inventor has found that resist residual and scum in the bottom portion of the resist pattern are thereby removed. These residual and scum are non-dissolved portions of the resist, and are not the reaction products generated by the development which are objects to be removed in the cleaning after the first development. These residual and scum in the resist bottom surface are so-called significant points which have a possibility of forming defects after the development, and do not substantially contribute to the uniformity in the plane. Therefore, the problem in the related-art development is not solved in the Jpn. Pat. Appln. KOKAI Publication No. 2-46464. Moreover, as not especially described, in this case, the rinse solution usually indicates the pure water. This respect is a large difference from the method described in the present embodiment.

In general, when the pure water is used to clean the substrate in the first cleaning treatment after the first development, the developing solution having high pH is replaced with the pure water of pH7, a rapid pH change is generated in the resist surface, and an alkali hardly soluble layer is formed. Therefore, in the second development of the pattern from which the reaction product is clearly removed, dissolution by alkali uniformly starts from this hardly soluble layer. The surface shape of the hardly soluble layer finally formed when the first development shifts to the cleaning is reflected and left. On the other hand, the hardly soluble layer formed during the replacement of the developing solution with the cleaning solution strongly reflects influences such as exposure amount dispersion or focus dispersion at an exposure time and developing rate dispersion in initial development. In general, uniformity is bad. Therefore, the dimensional uniformity in the substrate plane of the resist pattern formed after the development is deteriorated as compared with usually only one development. Therefore, it has been seen that the problem by the related-art developing method is not solved and additionally the dimensional uniformity in the substrate plane is deteriorated in the method of the Jpn. Pat. Appln. KOKAI Publication No. 2-46464.

The developing method described in the present embodiment is characterized in that the treatment is performed by the solution having the oxidizing property such as the ozone water between the first and second developing treatments. When the cleaning is performed first with the pure water and subsequently with the ozone water, the surface hardly soluble layer formed in contact with the pure water from the developing solution is treated with the ozone water, and thereby the surface is oxidized and changed in properties. Alternatively, the ozone concentration is slightly raised, the surface is slightly decomposed, and the hardly soluble surface becomes soluble to alkali. On the other hand, when the ozone water is used from the beginning to perform the cleaning, ozone molecules easily enter and oxidize the resist surface swelling with the developing solution. Therefore, even when pH drops, the resist surface is not substantially hardly-soluble, and keeps solubility to alkali. In any case, when the second development is successively performed, regardless of the first development, an image is developed faithfully to an optical profile at an exposure time to form the resist pattern. Furthermore, when the developing time has substantially the same length as the related-art developing time, the development sufficiently proceeds without being influenced by the reaction product or surface hardly soluble layer. Therefore, the influences of the exposure amount at the exposure time and focus dispersion are alleviated, and the dimensional uniformity in the plane of the resist pattern after the development. Moreover, by the cleaning with the oxidizing solution such as the ozone water, the reaction product existing between non-formed resist patterns is decomposed and can clearly be removed. Furthermore, it is also possible to remove the particles which could form defects after the development.

Moreover, a time for which the first cleaning solution is discharged from the first development is set to about five seconds in the present embodiment, and reasons for this are as follows.

Figure 17:
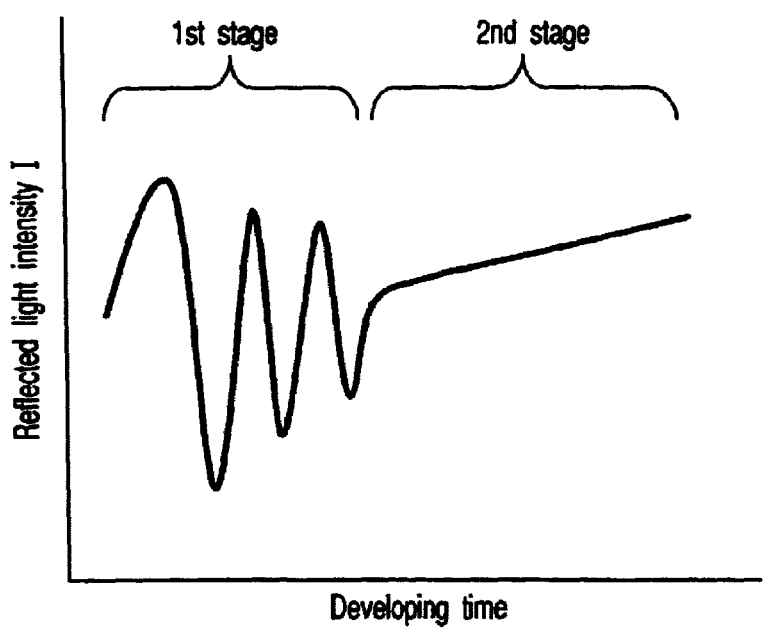
FIG. 17 is a diagram schematically showing a graph of a reflected light intensity from a conventional substrate obtained during observation of condition of dissolution by a developing solution of KrF positive type resist.
Figure 18A:
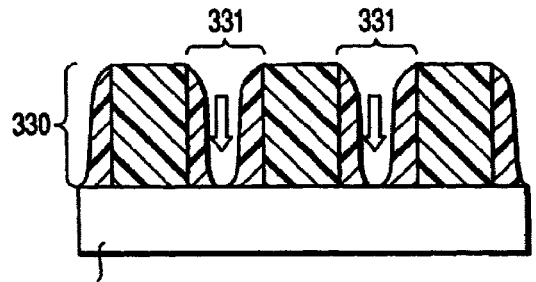
FIGS. 18A, 18B are sectional views schematically showing a resist film being developed.
Figure 18B:
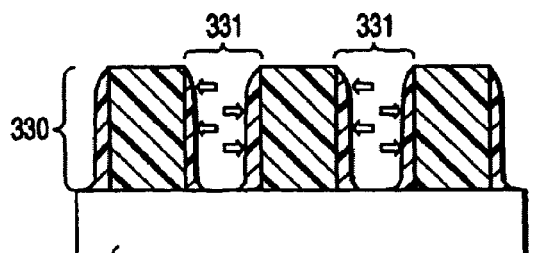

FIG. 17 schematically shows a graph of a reflected light intensity to time, obtained during observation of a state of dissolution of a KrF positive resist film by the developing solution. A sinusoidal wave seen in a first stage in FIG. 17 graph is an interference effect by a film thickness caused because the development proceeds in a depth direction of the film thickness. In general, for the resist, in this first stage immediately after development start, as shown in FIG. 18A, a dissolution rate is high in the soluble regions of exposed portions 331 of a resist film 330, the dissolution proceeds in the depth direction, and the positive resist for DUV exposure requires about five to ten seconds until the dissolution goes through the bottom surface of the resist. In a second stage, as shown in FIG. 18B, the development proceeds in a direction in which a resist pattern side wall is dissolved, not in the depth direction of the resist film thickness. At this time, reflection intensity slowly changes. In this second stage, the dissolution rate drops, the side wall of the resist pattern is dissolved to a desired dimension, and therefore the dissolution direction proceeds in a relatively horizontal direction.

In this manner, the dissolution of the resist proceeds in the depth direction in the first stage, and proceeds in a transverse direction in the second stage. This is because an exposure intensity slowly changes to a non-exposed portion from the exposed portion by an exposure intensity distribution by diffraction of unavoidable light in exposure of a projection type. By the distribution of the exposure intensity, a middle portion between the patterns which has a intense exposure amount, that is, which is sufficiently exposed comes off fastest at the development time. Therefore, the development rapidly proceeds in the depth direction as in the first stage. On the other hand, the developing rate is slow in the vicinity of the pattern wall whose exposure amount is small as compared with the middle portion. Therefore, the development slowly proceeds in the transverse direction as in the second stage. Most of dissolving materials which inhibit the development usually in the development are generated in this first stage.

In the present embodiment, the time for which the first cleaning solution is discharged from the first developing treatment is set to about five seconds after the development start. This is a position where the first stage switches to the second stage, that is, where the development proceeds in a reverse dir in the dissolved portion and goes through the bottom surface of the resist. This timing has the following reason.

The dissolution product generated once in this first stage is washed away during the change to the second stage from the first stage, and the alkali concentration can thereby be prevented from dropping by the dissolution product which inhibits the development from proceeding. If the first development is stopped earlier, the dissolution product is generated again in the next development stage to lower the alkali concentration, and inhibits the development. If the stop time of the first development is retarded, the alkali concentration locally drops by the generated dissolution product, and the developing rate locally drops in the development of the second stage. Thereafter, even if the development is performed with the fresh developing solution again, first formed spatial non-uniformity is not solved. By the first development stop time retarded from the time of the change to the second stage from the first stage, the local alkali concentration drop increases for each position, and the non-uniformity is also amplified.

The soluble region which is dissolved in the second stage and which remains in the vicinity of the pattern side wall has a low dissolution rate in the development. Moreover, the cleaning is performed once in the first stage, and thereafter the dissolution product which can vary the alkali concentration related to the development in time/space is already removed and hardly generated. Therefore, a pattern line width can sufficiently be controlled in the second development.

For the above-described two reasons, it is optimum to set a first timing of development stop to a change time between the first and second stages.

In the present embodiment, a point at which the first stage changes to the second stage in FIG. 17 was five seconds. This value changes by a resist material, developing solution, alkali concentration, temperature, and the like, and is not limited to the value of the present embodiment.

Next the effect of the present embodiment will be described based on the result of an experiment actually performed by the present inventors.

A wafer was successively coated with the reflection preventive film and KrF positive resist, and the reticle including the pattern constituted of a line and space each having a width of 200 nm (200 nmL/S pattern; L:S=1:1) and a pattern constituted of a line with a width of 200 nm and space with a width of 2000 nm (200 nm isolated line; L:S=1:10) was used to perform reduction/projection/exposure in the KrF excimer laser. After the heat treatment step, the developing treatment was performed. In the developing treatment step, four types of samples were prepared as follows. Conditions are shown in Table 1.

TABLE 1

|  | Sample A | Sample B | Sample C | Sample for reference |
|---|---|---|---|---|
| Pretreatment | Ozone water | Ozone water | Ozone water | Ozone water |
| First developing treatment | Present | Present | Present | Present |
| First cleaning treatment | Water | Ozone water | Pure water + ozone water | Absent |
| Second developing treatment | Present | Present | Present | Absent |

For all the wafers of the samples, pretreatment was performed with the ozone water, the developing solution supply amount from the developing solution supply nozzle was set to 1.5 L/min, the scanning speed of the nozzle was set to 60 mm/sec, and the developing solution film having a solution thickness of 1.5 mm was formed (first developing treatment). For a sample for reference, the subsequent first cleaning treatment and second developing treatment were not performed, and the developing solution film was formed once. Sample A was once cleaned with water in five seconds after the development start (first cleaning treatment), the developing solution supply amount from the developing solution supply nozzle was set to 1.5 L/min again, the scanning speed of the nozzle was set to 60 mm/sec, and the solution film having a solution thickness of 1.5 mm was formed (second developing treatment).

On the other hand, Sample B was subjected to the first cleaning treatment with the ozone water, and Sample C was subjected to the first cleaning treatment with the pure water. Thereafter, the samples were successively cleaned with the ozone water. Furthermore, a second developing solution film was formed in the same manner as in Sample A (second developing treatment). The subsequent second cleaning treatment and drying treatment were all performed on the same conditions.

Dimension evaluation results of these samples are shown in Table 2.

TABLE 2

|  | Sample A | Sample B | Sample c | Sample for reference |
|---|---|---|---|---|
| 1:1 pattern uniformity 3σ [nm] | 12.2 | 6.5 | 5.8 | 6.1 |
| 1:10 pattern uniformity 3σ [nm] | 15.2 | 8.2 | 7.8 | 8.3 |
| Coarseness/ denseness [nm] | 20 | 5 | 7.8 | 30 |

Table 2 shows a dimension difference of the lines of the 200 nmL/S pattern and 200 nm isolated line pattern on the same substrate as a coarse/dense difference. The coarse/dense difference in Table 2 is a value obtained by subtracting the dimension of the L/S pattern (1:1 pattern) from that of the isolated line pattern (1:10 pattern).

In the reference sample, the in-plane uniformity of the pattern dimension is relatively satisfactory. However, after the developing solution film is formed, the reaction product hardly moves. Therefore, the isolated line pattern (1:10 pattern) whose reaction region per unit area is large is thicker than the L/S pattern (1:1 pattern) whose reaction region per unit area is small by a dimension of 30 nm.

On the other hand, in Sample A the coarse/dense difference is slightly solved. On the other hand, the uniformity in the plane is largely deteriorated. Causes for these are considered as follows. First, a reason for a small coarse/dense difference is considered as follows. The amount of the reaction product existing usually in the vicinity of the pattern locally differs in coarse/dense portions of the resist pattern, and a local difference is also generated in the alkali ion concentration in the developing solution. However, the developing solution is once replaced with the pure water, and the fresh concentration developing solution is supplied again. Therefore, this local difference of the alkali concentration is eliminated. Therefore, regardless of the coarse/dense pattern, the development is promoted by the fresh developing solution, the image is developed faithfully to the original optical profile, and therefore the dimensional difference generated by the coarse/dense pattern is slightly reduced.

The problem of the dimensional uniformity in the plane is considered as follows. In general, the dissolution rate is high in a stage in which the developing time is short. In the stage in which the developing time is short, for example, when the exposure amount and exposure focus differ by the position on the wafer, the difference of the dissolution rate more remarkably appears. Since the development is usually performed in a sufficiently long time, this phenomenon is not seen. However, in the present embodiment the first rinse solution is discharged in the stage in which the developing time is short, and the first development stops. Therefore, the above-described effect is supposed to remarkably appear. Moreover, at this time, the pure water is applied in the middle of the actively occurring development reaction, rapid pH value change occurs, and the resist component coagulates in an interface between the resist and pure water. Especially the portion to be originally dissolved, such as the resist surface of the non-dissolved portion including the pattern side wall, is hardly soluble. Thereafter, the developing solution is again mounted, thereby the development is performed again, but the surface of the resist of the region where the dissolution originally proceeds coagulates by the contact with the pure water, and the solubility drops. Therefore, the shape of the hardly soluble layer formed by the contact with the pure water, not the original latent image, is reflected and the dissolution proceeds. Therefore, the bad uniformity at a time when the cleaning is performed in short time is maintained, and the development proceeds. As described above, the influence of the development inhibition caused by the reaction product by the development is eliminated, the coarse/dense difference thereby drops, but factors which largely influence the initial development such as the exposure amount or focus vibration exert the larger influence, and deteriorate the uniformity in the plane.

On the other hand, in Samples B and C, the uniformity in the wafer plane is enhanced to be equal to or more than that of the sample for reference. This is because the resist once brought in contact with the pure water coagulates, the hardly soluble layer is formed in the surface, but the ozone water is added to oxidize the hardly soluble layer in the resist surface of the non-dissolved portion such as the side wall of the pattern, and the solubility to the developing solution is in a maintained state. Therefore, when the fresh concentration developing solution is added again, the development is not inhibited by the surface hardly soluble layer of the resist by the pattern side wall, the phenomenon is successively promoted, and the dimensional uniformity in the plane is enhanced.

Moreover, the effect that the reaction product in the vicinity of the resist pattern is washed away by performing the rinsing once is the same as that of Sample A described above. When the second fresh developing solution is supplied, the local developing solution alkali concentration drop is not caused by the reaction product and is uniform, and therefore the coarse/dense difference of the dimension can largely be reduced.

Here, a reason why the uniformity of Sample B is slightly different from that of Sample C is that Sample B is cleaned all with the ozone water in the first cleaning treatment, the coagulation of the resist component in the rapid pH value change at a change time to the rinse solution from the developing solution is alleviated by the ozone water, and adaptability of the resist surface with respect to the developing solution is kept as such.

It is to be noted that the above-described first developing treatment, first cleaning treatment, second developing treatment, and second cleaning treatment can be performed using the apparatus shown in FIG. 30 or 31. The treatment performed using the apparatus shown in FIG. 30 will be described. At a first and second developing treatment time, while the developing solution is supplied onto the substrate from the nozzle for developing 121, the nozzle 220 is scanned/moved on the substrate. At a first cleaning treatment time, while the ozone water is supplied onto the substrate from the cleaning solution supply nozzle 102a, the nozzle 220 is scanned/moved on the substrate. At a second cleaning treatment time, the treatment is performed in the same manner as in the method described in the first embodiment.

The treatment performed using the apparatus shown in FIG. 31 will be described. At the first and second developing treatment time, while the developing solution is supplied onto the substrate from the nozzle for developing 121, the nozzle 220 is scanned/moved on the substrate. At the first cleaning treatment time, while the dry air is supplied from the first air supply nozzle 202a and the ozone water is supplied onto the substrate from the cleaning solution supply nozzle 102a, the nozzle 220 is scanned/moved on the substrate. At the second cleaning treatment time, the treatment is performed in the same manner as in the method described in the second embodiment.

FOURTH EMBODIMENT

Figure 19:
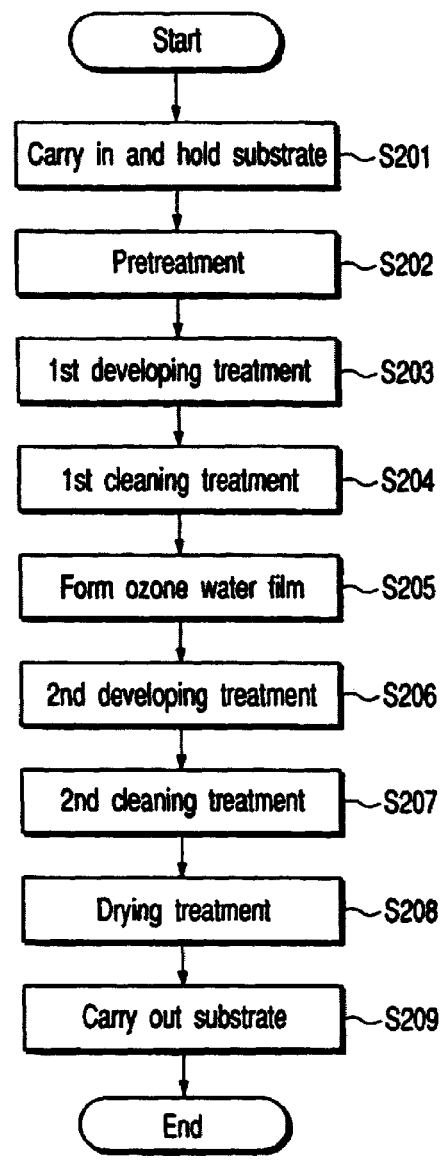
FIG. 19 is a diagram showing a flowchart of a developing treatment procedure according to a fourth embodiment.

FIG. 19 is a diagram showing a flowchart of the development treating procedure according to a fourth embodiment of the present invention.

Since steps S201 to S203 are similar to the steps S101 to S103 described in the third embodiment, the description thereof is omitted.

(Steps S204, S205)

The low-concentration ozone water was discharged from the rinse nozzle in about five seconds after the developing solution film was formed in the substrate main surface in step S203. Subsequently, the substrate was rotated, and almost all the cleaning solution was removed, but without drying the substrate, the cleaning solution was slightly left, and the ozone water film was formed.

(Step S206)

Subsequently, the developing solution for processing the resist film on the substrate was formed on the substrate in which the ozone water film was formed. The forming method of the developing solution film is similar to that of the third embodiment.

Since steps S207 to S209 are similar to the steps S107 to S109 described in the third embodiment, the description thereof is omitted.

The developing step of the present embodiment has substantially the same function as that of the third embodiment. In the present embodiment, the solution having the oxidizing property or weak alkali solution is left on the substrate main surface, and thereby the affinity of the developing solution to the substrate surface at the second developing treatment time is enhanced. Thereby, when the developing solution is supplied, a repulsive force acting between the developing solution and substrate surface is reduced, the developing solution can uniformly be supplied in the substrate plane, and as a result the in-plane uniformity of the dimension after the development is enhanced.

From the first cleaning treatment to the second developing treatment in the developing step, after the first cleaning treatment, the substrate was rotated at 500 rpm for ten seconds without being rotated at the high speed, and successively the second developing solution was discharged. The experiment was performed on conditions similar to those of Sample C of the third embodiment excluding the above-described respect. Results were 6.1 nm with the 1:1 pattern uniformity 3σ, and 7.5 nm with the 1:10 pattern uniformity 3σ, and the coarse/dense difference was 5 nm. These are sufficiently good values as compared with the sample for reference.

FIFTH EMBODIMENT

In the present embodiment, since the procedure of the development step is similar to that of the third embodiment, detailed description is omitted. In the present embodiment, at the first and second developing treatment time, gas molecules having the oxidizing property such as oxygen, or gas molecules having the reducing property such as hydrogen are dissolved in the developing solution.

Figure 20:
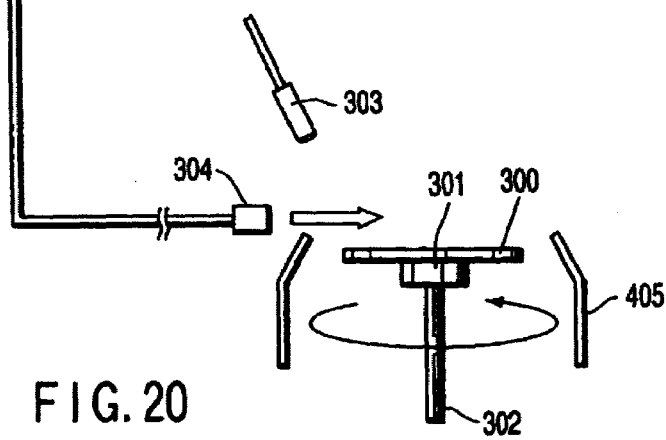
FIG. 20 is a diagram showing a schematic constitution of a developing treatment apparatus according to a fifth embodiment.

A treatment apparatus for use in the present embodiment is shown in FIG. 20. As shown in FIG. 20, the present apparatus includes: a developing solution tank 401 in which the developing solution including the alkaline aqueous solution is stored; a dissolution film 402 connected to the developing solution tank 401 via a pipe; a oxidizing gas generator 403 and reducing gas generator 404 connected to the dissolution film 402 via pipes; and the developing solution supply nozzle 304 connected to the dissolution film 402 via the pipe. Moreover, a protective cover is disposed around the substrate 300. It is to be noted that the same components as those of the developing apparatus shown in FIG. 12 are denoted with the same reference numerals and the description thereof is omitted.

In the present apparatus, the gas generated by the oxidizing gas generator 403 or reducing gas generator 404 is dissolved in the dissolution film 402, the developing solution supplied from the developing solution tank 401 is passed through the dissolution film 402, and the oxidizing or reducing gas is dissolved in the developing solution. In this apparatus, the oxidizing gas (reducing gas) can be dissolved in the developing solution immediately before the developing solution is discharged to the substrate 300.

In the present embodiment, the oxygen gas which was the oxidizing gas was dissolved in the developing solution to perform the first and second developing treatments. Since the other treatments are similar to those of the third embodiment, the detailed description is omitted.

It is to be noted that the developing solution with the oxygen molecules dissolved therein was used in the first and second developing treatments, but the developing solution with the reducing gas molecules such as hydrogen molecules dissolved therein may also be used. Moreover, if the effect is sufficient, it is not necessary to use the developing solution with the oxidizing gas molecules dissolved therein at both the first and second developing treatment times, and the solution may be used at either one treatment time.

In the present embodiment, in addition to the function described in the third embodiment, the solution in which the oxidizing gas molecules are dissolved is used as the developing solution to perform functions including: the oxidizing of the reaction product generated immediately after the development start by the oxygen molecules in the developing solution and the decomposing of the reaction product; the oxidizing of the resist surface in the developing solution; and the alleviation of size growth by coagulation of the reaction product generated during the development.

Moreover, when the developing solution with the reducing gas molecules dissolved therein is used at both or either of the first and second developing treatment times, there are functions such as: the changing of the properties of the resist surface by reducing electrons; promotion of diffusion of the reaction product into the developing solution by a surface potential change of the reaction product; and the prevention of adhesion of the reaction product again to the resist surface by the change of the resist surface potential.

At the first and second developing treatment times, the developing solution in which the oxidizing gas molecules were dissolved was used to perform an experiment similar to that of the third embodiment. The experiment results were 3.8 nm with the 1:1 pattern dimensional uniformity of 3σ, and 6.1 nm with the 1:10 pattern, and anticipated effects were confirmed.

SIXTH EMBODIMENT

Figure 21:
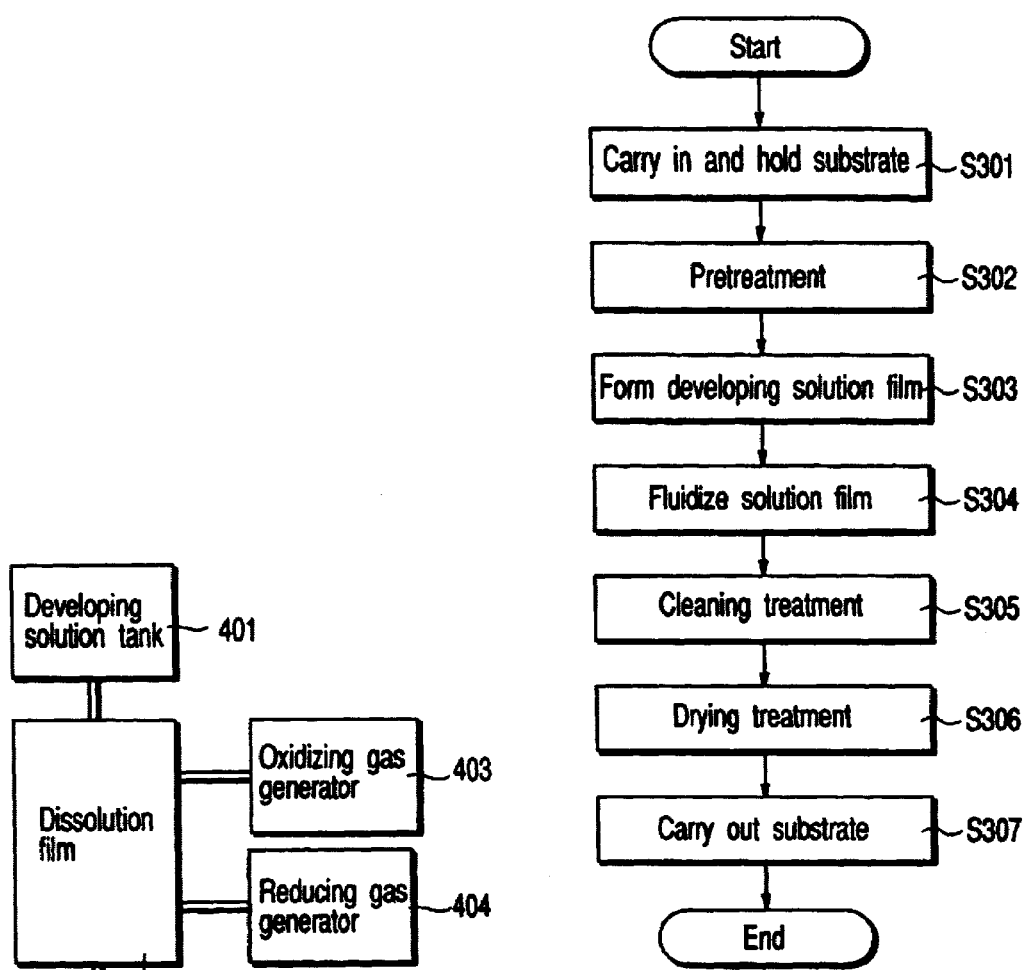
FIG. 21 is a diagram showing a flowchart of the developing treatment according to a sixth embodiment.

FIG. 21 is a diagram showing a flowchart of the development treatment according to a sixth embodiment of the present invention.

Since the procedure in the pattern treating method of the present embodiment is similar to that of the third embodiment, illustration of the flowchart and detailed description of the procedure are omitted.

Figure 22:
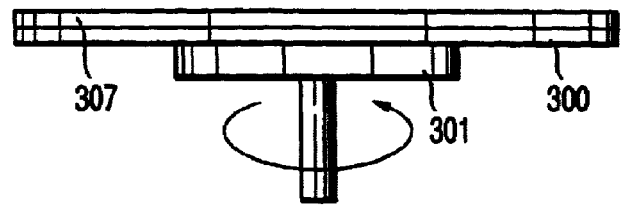
FIG. 22 is a process diagram showing the developing treatment according to the sixth embodiment.

In the present embodiment, at the first developing treatment time, after forming the developing solution film, the development is performed while the substrate is in a stationary state. Subsequently, after the elapse of a predetermined time, as shown in FIG. 22, the substrate 300 is rotated at a predetermined revolution number, and the developing solution 307 is fluidized. After rotating the substrate for the predetermined time and fluidizing the developing solution, the substrate is again stopped, and the exposure is performed in the stationary state.

In the present embodiment, a time zone in which the developing solution is fluidized is determined as follows.

As described in the third embodiment, the development is constituted of: the first stage in which the development proceeds in the depth direction of the film thickness; and the second stage in which the development proceeds in the direction for dissolving the resist pattern side wall after the first stage.

A purpose of the fluidizing of the solution in the developing step lies in that the reaction product generated during the development is uniformed, and alkali concentration is recovered. Therefore, the solution may effectively be fluidized so as to include a time to switch to the second stage in which the reaction product is hardly generated after the first stage in which a large amount of reaction product is generated (this time will hereinafter be referred to an off time).

Next, a way to determine the off time will be described. It is to be noted that the method of determining the off time described hereinafter may also be used to determine a start timing of the first cleaning treatment described in the third embodiment.

A first method comprises: allowing a light to be incident upon the pattern which is an object; measuring a change of the reflected light intensity obtained by reflection; obtaining results as shown in FIG. 17; and obtaining the off time. At this time, for the reflected light intensity of FIG. 17, a reflected light having a single wavelength is more preferable. Therefore, the incident light is set to the single wavelength using a narrow band filter, or a measured reflected light may be split. The off time may be measured before the development is actually performed, or may be measured in the developing step with respect to each substrate.

As a second method, there is a method of: developing the pattern which is an object in a plurality of developing times; observing the sectional shape of the pattern after the development; and obtaining a time in which the resist of the soluble region is developed to the bottom surface. Next, the measurement of the off time will be described based on two experiment results.

Figure 23:
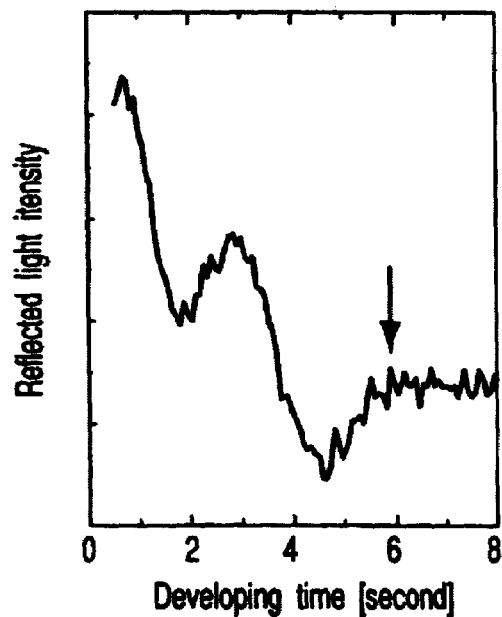
FIG. 23 is a diagram showing a reflected light intensity change from the resist film being developed.

A first experiment object pattern was set to a 130 nmL/S(1:1) pattern (reflection preventive film having a film thickness of 60 nm, resist with a film thickness of 300 nm, and resist whose dissolution rate is relatively high). First, the reflected light intensity during the development of the object pattern shown in FIG. 23 was acquired. The reflection intensity indicates a result of a case in which a light with a wavelength of 550 nm was incident. From this result, the off time of six seconds was obtained, and the time to fluidize the solution was determined based on this value.

Figure 24:
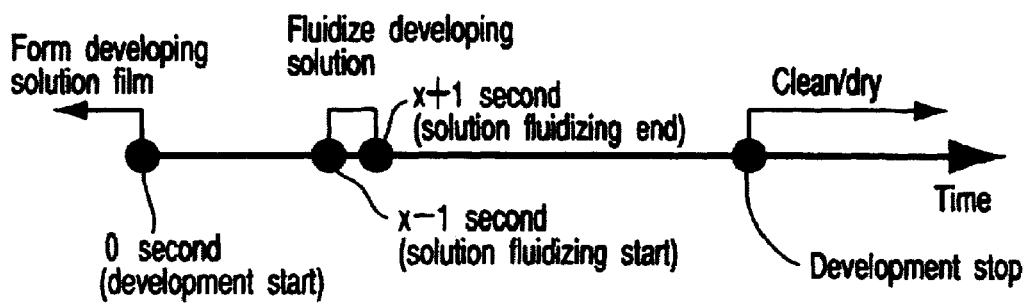
FIG. 24 is a diagram showing a flow of developing start, developing solution flow, and developing end along a time axis.
Figure 25:
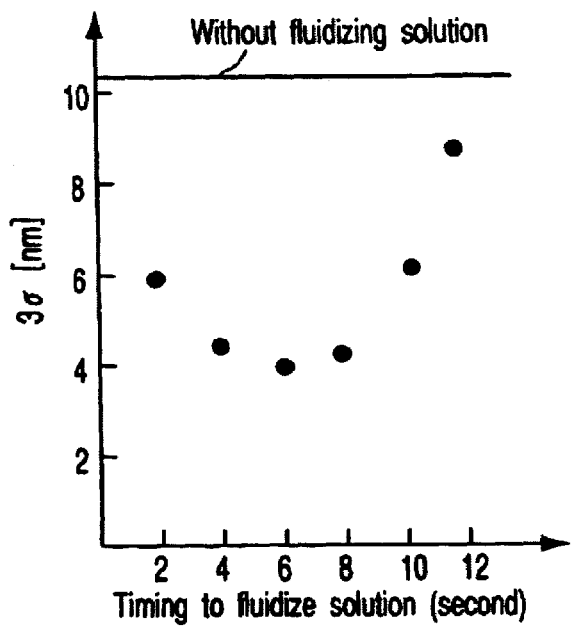
FIG. 25 is a diagram showing a relation between timing and dispersion of solution flow.

A diagram in which a flow of development start, developing solution flow, and development end is shown along a time axis is shown in FIG. 24. After a developing solution supply step, stationary development is performed for (x−1) seconds. Thereafter, the substrate was rotated at a predetermined revolution number (250 rpm) for two seconds, and the developing solution was fluidized. The development was stopped in 30 seconds after the development start. At this time, x was defined as the timing to fluidize the solution. The dispersion (3σ) of 130 nmL/S(1:1) pattern with a change of x in two to 12 seconds is shown in FIG. 25. The dispersion without fluidizing any solution is 10.2 nm. Since the solution was fluidized, the dispersion decreased. Especially, best uniformity was obtained with six seconds. Moreover, the uniformity was relatively good with four, eight seconds. That is, with the solution flow in the vicinity of the off time obtained from the reflected light intensity change of the object pattern (off time ± two seconds, that is, off time ±33%), good uniformity is obtained.

It is obvious from the experiment that the timing of to fluidize the solution is set in the vicinity of the off time (time in which the resist of the soluble region is developed to the bottom surface) and the uniformity is enhanced. However, when the solution fluidizing start time can be set only after the off time because of restrictions of the apparatus such as the movement of the developing solution supply nozzle (e.g., when the substrate cannot be rotated in and after nine seconds), the solution may be fluidized as early as possible (e.g., nine seconds).

Figure 26:
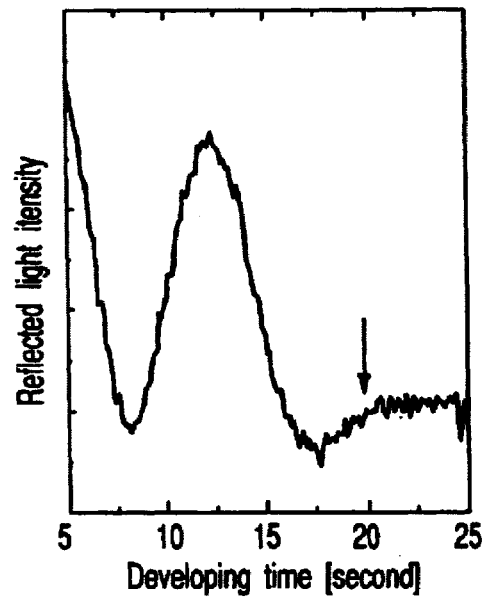
FIG. 26 is a diagram showing the reflected light intensity change from the resist film being developed.

A second experiment object pattern was set to the 130 nmL/S(1:1) pattern (reflection preventive film having a film thickness of 60 nm, resist with a film thickness of 300 nm, and resist whose dissolution rate is relatively low). First, the reflected light intensity during the development of the object pattern shown in FIG. 26 was acquired. This is a result of the case in which the light with a wavelength of 550 nm was incident. From this result, the off time of 20 seconds was obtained, and the time to fluidize the solution was determined based on this value.

Figure 27:
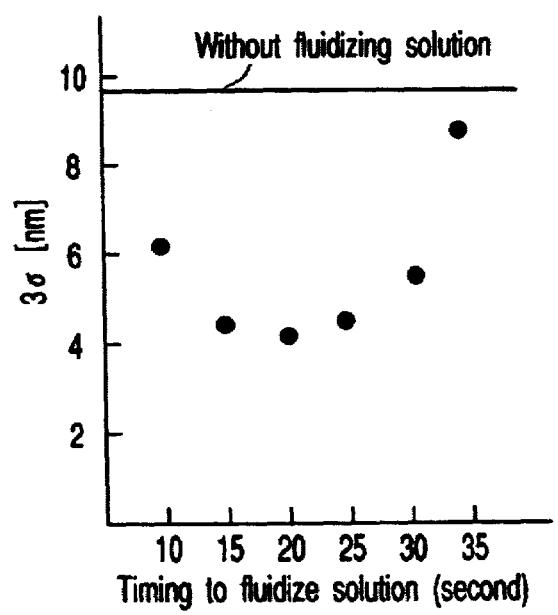
FIG. 27 is a diagram showing a relation between the timing and dispersion of the solution flow.

A diagram in which a sequence is shown along the time axis is shown in FIG. 24. After the developing solution supply step, the stationary development was performed for (x−1) seconds. Thereafter, the substrate was rotated at the predetermined revolution number (250 rpm) for two seconds, and the developing solution was fluidized. The development was stopped in 60 seconds after the development start. At this time, x was defined as the timing to fluidize the solution. The dispersion (3σ) of the 130 nmL/S (1:1) pattern with a change of x in ten to 35 seconds is shown in FIG. 27. The dispersion without fluidizing any solution is 9.8 nm. Since the solution was fluidized, the dispersion decreased. Especially, best uniformity was obtained with 20 seconds. Moreover, the uniformity was relatively good with 15, 25 seconds. That is, with the solution flow in the vicinity of the off time obtained from the reflected light intensity change of the object pattern (off time ± five seconds, that is, off time ±25%), good uniformity was obtained.

In the present embodiment, a method of rotating the substrate has been described as the method of fluidizing the solution. Any method may be used as long as the developing solution is fluidized, such as a method of forming an air current in the surface of the developing solution film to fluidize the developing solution; a method of bringing a material for causing the flow in contact with the developing solution on the substrate or moving the material or substrate to fluidize the developing solution; a method of vibrating the substrate to which the developing solution is supplied to fluidize the developing solution; and a method of heating a material to be treated to fluidize the developing solution by convection.

Moreover, in the present embodiment, the L/S pattern is used as the object pattern, but any pattern may also be used such as an isolated remaining pattern, isolated through pattern, hall pattern, and pillar pattern. For each pattern, after the off time is obtained, the timing to fluidize the solution may be determined. When a plurality of patterns are included at the same time (e.g., the isolated remaining pattern and L/S pattern), the solution may be fluidized twice after each off time, and the timing to fluidize the solution may also be determined from the off time of only the pattern having strict precision.

A large number of proposals to fluidize the developing solution have been reported. Examples of the proposals include: a method comprising supplying the developing solution onto the substrate, forming the air current so as to contact the surface of the developing solution film, holding the developing solution film on the substrate to form the flow of the surface, and fluidizing the developing solution (Jpn. Pat. Appln. KOKAI Publication No. 2001-228625); a method of bringing a tip end of the nozzle for supplying the developing solution in contact with the developing solution on the substrate, and moving the nozzle or substrate to fluidize the developing solution (Jpn. Pat. Appln. KOKAI Publication No. 2000-195773); and a method of vibrating the substrate to which the developing solution has been supplied at a predetermined frequency to fluidize the developing solution (Jpn. Pat. Appln. KOKAI Publication No. 2001-307994). However, in any proposal, the timing to fluidize the solution after the developing solution supply is not described. As a result, since the solution is not fluidized in an appropriate time zone, the solution cannot effectively be fluidized, and the sufficient dimensional uniformity was not obtained.

SEVENTH EMBODIMENT

In the semiconductor manufacturing process, an operation of paddle-forming the developing solution on the substrate in which the resist film is formed, and processing the resist film in a desired shape is repeatedly performed. In the related art, the substrate in which the resist film is formed has heretofore been coated with the developing solution to perform the developing step. In general, the developing solution supply nozzle is used to supply the developing solution. In the developing method in which the developing solution supply nozzle is used in this manner, the tip end of the nozzle from which the developing solution is discharged is positioned in the vicinity of the substrate, and the solution is supplied. Therefore, the developing solution in which the resist is dissolved contacts the nozzle. As a result, a solid material of the resist sticks to the developing solution supply nozzle. This sticking material sometimes causes the defect of the substrate.

As means for solving this problem, the nozzle is cleaned by the developing solution, or the nozzle is cleaned by a high-concentration developing solution (Jpn. Pat. Appln. KOKAI Publication No. 2001-319869). In these methods, since the developing solution is used as the cleaning solution, only the defect soluble to the developing solution can be removed. Moreover, the use of the developing solution raised a problem of cost increase.

Figure 28:
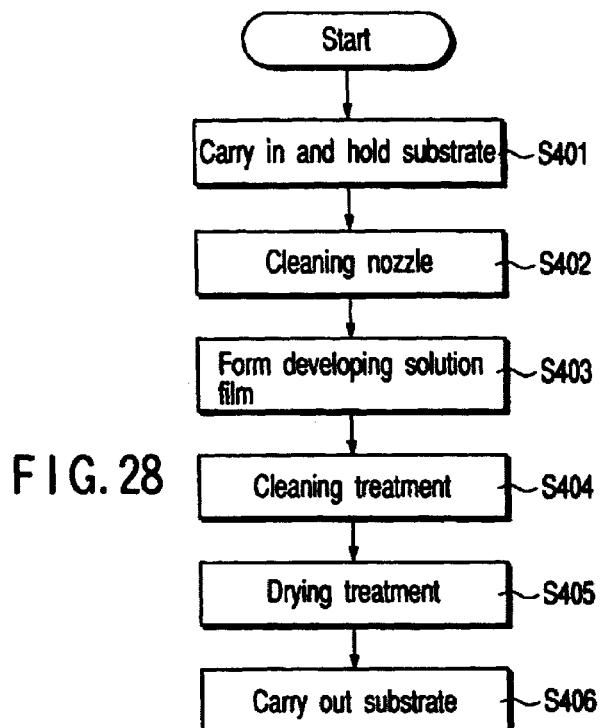
FIG. 28 is a diagram showing a flowchart of the developing treatment according to a seventh embodiment.
Figure 29:
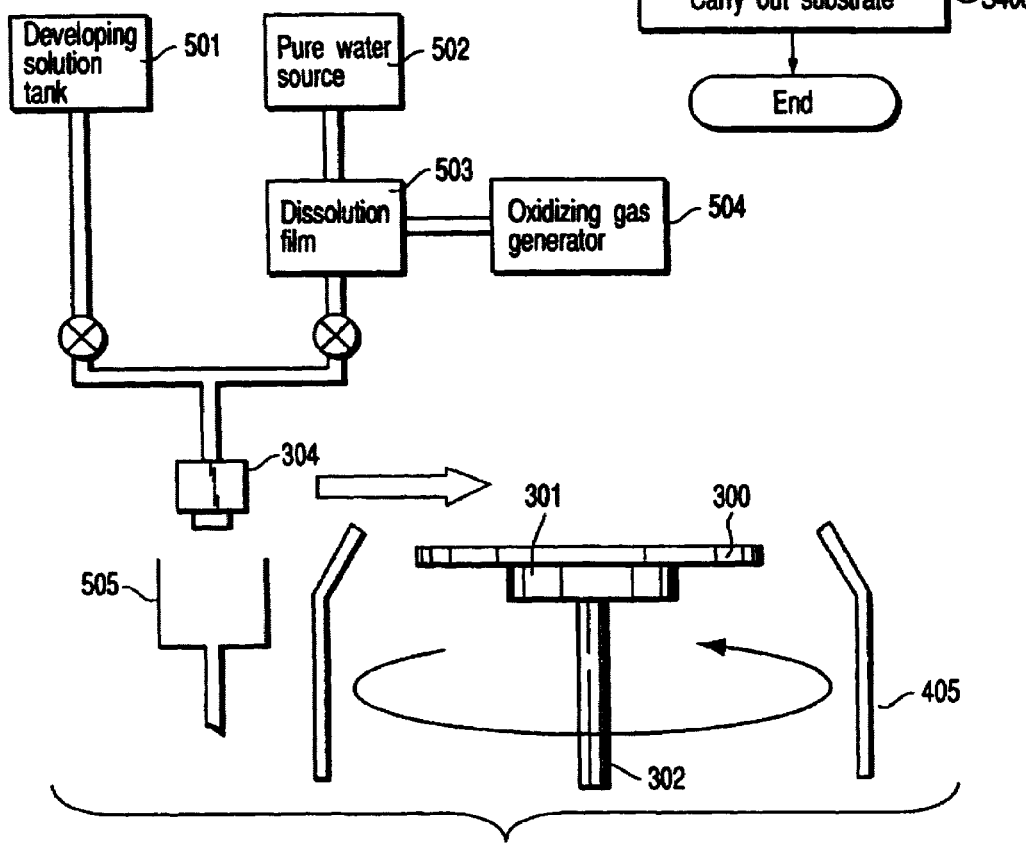
FIG. 29 is a diagram showing a schematic constitution of the developing treatment apparatus according to the seventh embodiment.

FIG. 28 is a flowchart showing a treating procedure of a pattern method according to a seventh embodiment of the present invention. FIG. 29 is a schematic diagram of a constitution of the developing apparatus according to the third embodiment of the present invention. Moreover, the development treating method according to the third embodiment of the present invention will be described with reference to FIGS. 28 and 29.

(Step S401)

The substrate is coated with the reflection preventive film and the resist of the chemical amplification type, and the KrF excimer laser is used to reduce/project/expose a desired pattern via the reticle for exposure. The substrate is heat-treated, transferred to the upper part of the substrate holding portion by the transfer robot, and sucked and fixed onto the substrate holding portion.

(Step S402)

Next, ozone generated by an oxidizing gas generator 504 is supplied to a dissolution film 503, the pure water is supplied to the dissolution film 503 from a pure water source 502, and ozone is dissolved in the pure water and generated. Subsequently, the generated ozone is supplied to the developing solution supply nozzle 304. When the developing solution supply nozzle 304 discharges the ozone water, the developing solution supply nozzle 304 is cleaned. The ozone water discharged from the developing solution supply nozzle 304 is received by a solution receiver 505, and the ozone water is pooled in the solution receiver 505. When the developing solution supply nozzle 304 is immersed in the ozone water pooled in the solution receiver 505, the surface of the developing solution supply nozzle 304 disposed opposite to the resist film is cleaned.

After cleaning the developing solution supply nozzle 304, the developing solution is supplied to the developing solution supply nozzle 304 from a developing solution tank 501, the developing solution is discharged from the developing solution supply nozzle 304, and the ozone water in the nozzle is replaced with the developing solution.

It is to be noted that when the oxidizing gas can be line-supplied, the oxidizing gas generator 504 is unnecessary. Moreover, in addition to ozone, oxygen, carbon monoxide, and hydrogen peroxide may also be used as the oxidizing gas.

(Step S403)

Next, the developing solution film which processes the resist film on the substrate is formed on the substrate. Here, the linear developing solution supply nozzle is used to supply the developing solution while the nozzle is scanned from one end to the other end of the wafer to form the developing solution film on the substrate.

(Step S404)

After a predetermined time, the rinse solution (e.g., pure water) is supplied from the rinse nozzle disposed above the substrate, and the substrate is rotated/cleaned.

(Step S405)

Furthermore, the substrate is rotated at the high speed to throw off the pure water, and the substrate is dried.

In the present embodiment, the ozone water in which ozone is dissolved in the pure water is used as the oxidizing solution, but gas molecules to be dissolved are not limited to ozone as long as the similar effect is obtained. For example, the oxidizing gases such as oxygen, carbon monoxide, and hydrogen peroxide may also be used. Moreover, the nozzle is cleaned before supplying the developing solution in the present embodiment, but may also be cleaned after the developing solution supply. Furthermore, each substrate does not have to be cleaned, and every predetermined number of substrates may be cleaned, or the substrate may be cleaned for each predetermined time. Moreover, the cleaning may also be performed after maintenance such as the change of the nozzle.

When the developing treatment is repeated, the developing solution supply nozzle contacts the developing solution with the resist dissolved therein, and thereby the organic particles stick to the nozzle. In the subsequent developing treatment of the substrate, the particles stick to the resist surface, and has a possibility of remaining as the defect.

During the cleaning, the ozone molecules in the solution collide against the particles sticking to the nozzle, oxidize the particles at a certain probability, and are supposed to decompose the particles. The decomposed particles form low molecules, the mass is sufficiently reduced, and the particles are easily diffused into the solution. As a result, the particles are removed.

The result of the experiment actually performed by the inventors will be described hereinafter.

The experiment was performed following the procedure shown in the flowchart of FIG. 28. To confirm the effect, in step S402, the number of organic matter sticking defects were measured, when the nozzle was cleaned with the ozone water having an ozone concentration of 10 ppm in the solution for five seconds, when the nozzle was cleaned with the developing solution for five seconds, and the nozzle was not cleaned. In the respective cases, the number of defects was five, ten, 50 defects. When the nozzle was cleaned with the ozone water, the number of defects was reduced. From these results, it has been confirmed that the cleaning of the developing solution supply nozzle 304 by the ozone water is very effective.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate treating method comprising:
supplying a treating solution onto a substrate; and
continuously discharging a first cleaning solution to the substrate from a first discharge region disposed in a nozzle, while moving the nozzle and substrate with respect to each other in one direction,
wherein a length of a direction crossing at right angles to the direction of the first discharge region is equal to or more than a maximum diameter or longest side of the substrate,
the nozzle continuously spouts a first gas to the substrate from a first jet region, and the length of a direction crossing at right angles to the direction of the first jet region is equal to or more than the maximum diameter or longest side of the substrate,
the first jet region is disposed on a rear side of the first discharge region with respect to the movement direction,
the nozzle discharges a second cleaning solution to the substrate from a second discharge region,
the length of the direction crossing at right angles to the direction of the second discharge region is equal to or more than the maximum diameter or longest side of the substrate,
the second discharge region is disposed on the rear side of a first jet port with respect to the movement direction,
the nozzle spouts a second gas to the substrate from a second jet region,
the length of the direction crossing at right angles to the direction of the second jet region is equal to or more than the maximum diameter or longest side of the substrate, and
the second jet region is disposed on the rear side of a second discharge port with respect to the movement direction.

2. The substrate treating method according to claim 1, wherein the nozzle moves from one end to the other end of the substrate.

3. The substrate treating method according to claim 1, further comprising: a bubble is included in the first cleaning solution before the first cleaning solution reaches the substrate.

4. The substrate treating method according to claim 1, wherein a photo resist film is formed in the surface of the substrate, and
the treating solution is a developing solution which treats the photo resist film.

5. The substrate treating method according to claim 4, wherein the first cleaning solution stops the treatment of the photo resist film by the developing solution.

6. The substrate treating method according to claim 1, further comprising: spouting a third gas to the substrate from a third jet region disposed in the nozzle,
wherein the length of the direction crossing at right angles to the direction of the third jet region is equal to or more than the maximum diameter or longest side of the substrate, and
the third jet region is disposed on the front side of the first discharge region with respect to the movement direction.

7. The substrate treating method according to claim 1, further comprising: a bubble is included in the second cleaning solution before the second cleaning solution reaches the substrate.

8. The substrate treating method according to claim 1, wherein the first cleaning solution is an oxidizing solution, and the second cleaning solution is a reducing solution or pure water.

9. The substrate treating method according to claim 8, wherein the first cleaning solution is an ozone water, and the second cleaning solution is a hydrogen water.

10. The substrate treating method according to claim 9, wherein an ozone concentration in the ozone water is in a range of 0.1 to 5 ppm.

11. The substrate treating method according to claim 9, wherein a hydrogen concentration in the hydrogen water is in a range of 0.1 to 5 ppm.

12. The substrate treating method according to claim 1, wherein the supplying of the treating solution comprises: continuously discharging the treating solution to the substrate from a discharge port disposed in a second nozzle; and moving the second nozzle and substrate with respect to each other in one direction, and
a change of a positional relation with time between the substrate and first nozzle is the same as that between the substrate and second nozzle.

* * * * *